(12) United States Patent
Otaki et al.

(10) Patent No.: US 7,038,555 B2
(45) Date of Patent: *May 2, 2006

(54) PRINTED WIRING BOARD FOR CONTROLLING SIGNAL TRANSMISSION USING PAIRED INDUCTANCE AND CAPACITANCE

(75) Inventors: Toru Otaki, Tokyo (JP); Tatsuo Nishino, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 44 days.

This patent is subject to a terminal disclaimer.

(21) Appl. No.: 11/094,133

(22) Filed: Mar. 31, 2005

(65) Prior Publication Data

US 2005/0168956 A1 Aug. 4, 2005

Related U.S. Application Data

(62) Division of application No. 10/453,766, filed on Jun. 4, 2003, now Pat. No. 6,940,362.

(30) Foreign Application Priority Data

Jun. 12, 2002 (JP) .............................. 2002-171197

(51) Int. Cl.
*H03H 7/38* (2006.01)
(52) U.S. Cl. .......................................... 333/33; 333/32
(58) Field of Classification Search ................ 333/33, 333/32; 361/780, 782, 766, 794, 752, 762
See application file for complete search history.

(56) References Cited

U.S. PATENT DOCUMENTS

| 5,777,526 A | * | 7/1998 | Kawasaki ...................... 333/1 |
| 5,847,451 A | * | 12/1998 | Ohtaki et al. ............... 257/697 |
| 6,614,663 B1 | * | 9/2003 | Yokota et al. .............. 361/780 |
| 2003/0104728 A1 | | 6/2003 | Inagawa et al. ............ 439/610 |
| 2003/0231473 A1 | * | 12/2003 | Otaki et al. ................. 361/777 |

OTHER PUBLICATIONS

"Electronics", Jisso Gakkaishi, vol. 4, No. 7 (2001), pp. 549, 565-566, no month.
"Controlling Radiated Emissions by Design", 2$^{nd}$ ed. by Michael Mardiguian, 2001, publ. by Kluwer Academic, pp. 51-75, no month.

* cited by examiner

*Primary Examiner*—Rexford Barnie
*Assistant Examiner*—Joseph Lauture
(74) *Attorney, Agent, or Firm*—Fitzpatrick, Cella, Harper & Scinto

(57) ABSTRACT

In a printed wiring board in which wiring patterns for interconnecting a plurality of integrated circuits (ICs) operating with synchronizing signals, in order to make signal transmission times between a plurality of IC's the same, consecutively formed pairs of an inductance pattern and a capacitive pattern, are constructed at each of wiring patterns for interconnecting a plurality of IC's. By changing the shapes of the inductance pattern and the capacitive pattern, it is possible to adjust signal propagation velocities and signal transmission times.

20 Claims, 16 Drawing Sheets

PRINTED WIRING BOARD FOR CONTROLLING SIGNAL TRANSMISSION USING PAIRED INDUCTANCE AND CAPACITANCE

This application is a divisional of U.S. patent application Ser. No. 10/453,766, filed Jun. 4, 2003 U.S. Pat. No. 6,940,362, the contents of which are incorporated by reference herein.

BACKGROUND OF THE INVENTION

1. Field of the Invention

The present invention relates to the shape of a printed pattern on a printed wiring board, and more particularly, to a printed wiring board for a high-speed circuit requiring adjustment of signal propagation times between respective electronic components.

2. Description of the Related Art

In printed wiring boards, the speed of integrated circuits (ICs) mounted thereon is increasing. Accordingly, in order to normally operate digital circuits operating with synchronizing signals, it is necessary to adjust signal transmission times in wiring patterns for propagating synchronizing signals, such as clock signals, from a clock-signal-generator IC to a memory IC. In wiring a bus which includes a plurality of wiring patterns, the signal transmission times between two ICs must be the same. Since skew is generated due to the difference between signal transmission times, it is desirable to minimize the difference.

FIG. 19 is a diagram illustrating a conventional technique. In FIG. 19, there is shown a printed circuit board 100. A clock-signal generator IC 102, and synchronous dynamic random access memory (SDRAM) ICs 103, 104 and 105 having the same electronic characteristics are mounted on a printed wiring board 101. In this circuit, synchronized clock signals A, B and C are transmitted from the clock-signal generator IC 102 to the SDRAM ICs 103, 104 and 105 via wiring patterns 110, 120 and 130, respectively. The distance from the clock-signal generator IC 102 to SDRAM ICs 103, 104 and 105 differs, because of mounting limitations. There are also shown IC leads 106, 107, 108 and 109.

In this high-speed circuit, it is desirable for the SDRAM ICs 103, 104 and 105 to operate simultaneously. Accordingly, the signal transmission times of the clock signals A, B and C from the clock-signal generator IC 102 to the SDRAM ICs 103, 104 and 105 must be the same. By forming a zigzag pattern 121 in wiring pattern 120, and forming a zigzag pattern 131 longer than the zigzag pattern 121 at the wiring pattern 130, the lengths of the wiring patterns 110, 120 and 130 are made the same, so that the signal transmission times of the clock signals A, B and C are the same.

FIG. 20 illustrates a technique relating to a bus wiring pattern between two ICs. In FIG. 20, there is shown a printed circuit board 200. A memory controller IC 202 and an SDRAM IC 203 are mounted on a printed wiring board 201. The memory controller IC 202 and the SDRAM IC 203 are interconnected by a bus wiring pattern, so that a bus signal is transmitted from the memory controller IC 202 to the SDRAM IC 203. In FIG. 20, in order to facilitate explanation, only three wiring patterns 210, 220 and 230 of the bus wiring pattern are shown, and other wiring patterns are omitted. It is necessary to adjust signal transmission times of the bus signal from the memory controller IC 202 to the SDRAM IC 203. In order to provide the same wire length for the wiring patterns 210, 220 and 230, a zigzag pattern 221 is formed at the wiring pattern 220, and a zigzag pattern 231 longer than the zigzag pattern 121 is formed at the wiring pattern 230. There are also shown IC leads 206 and 207.

FIG. 21 is a diagram illustrating another technique. In FIG. 21, there is shown a printed circuit board 300. A clock-signal generator IC 302, a memory controller IC 303 and an SDRAM IC 304 are mounted on a printed wiring board 301. The clock-signal generator IC 302 is mounted at a portion closer to the memory controller IC 303 than the SDRAM IC 304 because of mounting limitations. In this circuit, a clock signal D and a clock signal E are transmitted from the clock-signal generator IC 302 to the memory controller IC 303 and the SDRAM IC 304 via wiring patterns 310 and 320, respectively. The memory controller IC 303 and the SDRAM IC 304 are interconnected by a bus wiring pattern 330. During data writing into the SDRAM IC 304, the memory controller IC 303 transmits a bus signal F to the SDRAM IC 304 via the bus wiring pattern 330 using the clock signal D. During data reading from the SDRAM IC 304, the SDRAM IC 304 transmits a bus signal F' to the memory controller IC 303 via the bus wiring pattern 330 using the clock signal E. There are also shown IC leads 306, 307 and 308.

In this high-speed circuit, it is desirable for the clock signal E and the bus signal F to simultaneously reach the SDRAM IC 304. It is also desirable for the clock signal D and the bus signal F' transmitted from the SDRAM IC 304 to the memory controller IC 303 to reach the memory controller IC 303 simultaneously.

Accordingly, in such two-way transmission, if the input/output DC and AC characteristics of the clock-signal generator IC 302 and the SDRAM IC 304 are to be identical, the signal transmission time to the memory controller IC 303 must be the same for the clock signals D and E. If the input/output DC and AC characteristics of the clock-signal generator IC 302 and the SDRAM IC 304 differ, signal transmission times must be adjusted depending on the difference. Accordingly, the signal transmission time of the clock signal D is adjusted by forming a zigzag pattern 311 at the wiring pattern 310 for transmitting the clock signal D.

As still another technique, U.S. Pat. No. 5,777,526 discloses a method for adjusting, when there is a difference between propagation times of signals transmitted via two strip conductors, a propagation velocity per unit length by changing the dielectric constant of a dielectric disposed immediately below a strip conductor.

It has become clear that, in the zigzag pattern approach, there is not necessarily a perfect correlation between wire length and propagation time (Electronics Jisso Gakkaishi, Vol. 4, No. 7 (2001), p 549, p 565). Accordingly, it is impossible to adjust the propagation times of clock signals only by adjusting the wire length using a zigzag pattern.

Another problem is in that, in order to form a zigzag pattern, a region for the zigzag pattern must be secured when designing a printed wiring board, resulting in limitation in the degree of freedom of design. Specifically, in the case of the bus wiring pattern shown in FIG. 20, since wires are densely packed, it may be impossible to implement a zigzag pattern because of limitation of a space.

In the method described in U.S. Pat. No. 5,777,526, although the propagation times of signals can be adjusted, formation of substances having different dielectric constants within the same substrate is unrealistic, because complicated manufacturing processes must be used, and therefore the production cost will be greatly increased. For example, in a digital circuit including a high-speed memory and a central processing unit (CPU), since the number of signal patterns is large and signal patterns must be narrow pitch, it is very difficult and unrealistic to change dielectric constants for respective patterns.

SUMMARY OF THE INVENTION

It is an object of the present invention to provide a printed wiring board having wiring patterns for interconnecting a plurality of ICs operating with synchronizing signals in which, by forming a plurality of respective pairs of an inductance pattern and a capacitive pattern consecutively at each wiring pattern, signal propagation times between respective ICs can be adjusted, and skew generation is suppressed.

According to one aspect of the present invention, a printed wiring board includes lands adapted to mount a plurality of ICs operating with synchronizing signals, and a plurality of wiring patterns adapted to interconnect the lands where different IC's are mounted. A plurality of patterns, each having a pair of an inductance pattern and a capacitive pattern, are consecutively formed at at least part of each of the plurality of wiring patterns. The inductance pattern may have a meander shape or a spiral shape.

In a second aspect, the capacitive pattern is connected to the inductance pattern at part of the capacitive pattern, and a width of a connected portion with the inductance pattern of the capacitive pattern is equal to or less than a width of the inductance pattern.

According to a third aspect of the present invention, a printed wiring board includes a first land adapted to mount a first IC, and a second land adapted to mount a second IC, connected to the first land by a first wiring pattern. The first wiring pattern propagates a first signal from the first IC to the second IC. The printing wiring board also includes a third land adapted to mount a third IC having the same function as the second IC, connected to the first land by a second wiring pattern. The second wiring pattern propagates a second signal synchronized with the first signal from the first IC to the third IC. A plurality of patterns, each having a pair of an inductance pattern and a capacitive pattern, are consecutively formed at at least one of the first wiring pattern and the second wiring pattern that has a shorter wire length.

In a fourth aspect, transmission times of respective signals propagated by the first wiring pattern and the second wiring pattern are substantially the same.

In a fifth aspect, when a smaller one of a rise time $t_r$ from 10% to 90% of a maximum amplitude and a fall time $t_f$ from 90% to 10% of the maximum amplitude of a synchronizing signal propagated in a pattern having a pair of an inductance pattern and a capacitive pattern is represented by $t_s$, and a value of inductance and a value of capacitance corresponding to a length of ⅛ of a wavelength for a frequency f determined by $f=1/(\pi t_s)$ are represented by $L_s$ and $C_s$, respectively, a value of inductance $L_p$ and a value of capacitance $C_p$ by the pair of the inductance pattern and the capacitive pattern satisfy a relationship of $L_p \leq L_s$, and $C_p \leq C_s$.

In a sixth aspect, the wiring pattern including the pairs of the inductance pattern and the capacitive pattern has a first pattern shape formed by a plurality of consecutive patterns, each having a pair of the inductance pattern and the capacitive pattern, and a second pattern shape that does not have the pair of the inductance pattern and the capacitive pattern.

In a seventh aspect, characteristic impedance is substantially the same for the first pattern shape and the second pattern shape.

According to an eighth aspect of the present invention, a printed wiring board includes a first land adapted to mount a first IC, and a second land adapted to mount a second IC, connected to the first land by a first wiring pattern. The bus wiring pattern includes a plurality of wiring patterns, and transmits a bus signal from the first IC to the second IC. At least one of the plurality of wiring patterns is formed by a plurality of consecutive patterns, each having a pair of an inductance pattern and a capacitive pattern.

In a ninth aspect, transmission times of respective signals propagated by the plurality of wiring patterns are substantially the same.

According to a tenth aspect of the present invention, a printed wiring board includes a first land in which a first IC is mounted, and a second land in which a second IC is mounted, connected to the first land by a first wiring pattern. The first wiring pattern transmits a first signal from the first IC to the second IC. The printing wiring board also includes a third land adapted to mount a fourth IC having a function different from the second IC, connected to the first land by a third wiring pattern. The third wiring pattern transmits a third signal synchronized with the first signal from the first IC to the fourth IC. Transmission times of the first signal and the third signal are adjusted by forming a plurality of consecutive patterns, each having a pair of an inductance pattern and a capacitive pattern, at at least one of the first wiring pattern and the third wiring pattern.

According to an eleventh aspect of the present invention, a printed wiring board includes a first land adapted to mount a first IC, and a second land adapted to mount a second IC, connected to the first land by a first wiring pattern. The first wiring pattern propagates a first signal from the first IC to the second IC. The printing wiring board also includes a third land adapted to mount a fifth IC, connected to the second land by a fourth wiring pattern. The fourth wiring pattern propagates a fourth signal from the fifth IC to the second IC. Transmission times of the first signal and the fourth signal are adjusted by forming a plurality of consecutive patterns, each having a pair of an inductance pattern and a capacitive pattern, at at least one of the first wiring pattern and the fourth wiring pattern.

In a twelfth aspect, characteristic impedance of the first wiring pattern and characteristic impedance of the fourth wiring pattern are substantially the same.

In a thirteenth aspect, at least one of the first and fourth signals is a clock signal.

According to a fourteenth aspect of the present invention, a printed circuit board includes a first IC, and a second IC connected to the first IC by a first wiring pattern. The first wiring pattern propagates a first signal from the first IC to the second IC. The circuit wiring board also includes a third IC having the same function as the second IC, connected to the first IC by a second wiring pattern. The second wiring pattern propagates a second signal synchronized with the first signal from the first IC to the third IC. A plurality of patterns, each having a pair of an inductance pattern and a capacitive pattern, are consecutively formed at at least one of the first wiring pattern and the second wiring pattern that has a shorter wire length.

According to a fifteenth aspect of the present invention, a printed circuit board includes a first IC, and a second IC connected to the first IC by a first wiring pattern. The bus wiring pattern includes a plurality of wiring patterns and transmits a bus signal from the first IC to the second IC. At least one of the plurality of wiring patterns is formed by a plurality of consecutive patterns, each having a pair of an inductance pattern and a capacitive pattern.

According to a sixteenth aspect of the present invention, a printed circuit board includes a first IC, and a second IC connected to the first IC by a first wiring pattern. The first wiring pattern propagates a first signal from the first IC to the second IC. The printing circuit board also includes a fourth IC having a function different from the second IC, connected to the first IC by a third wiring pattern. The third wiring pattern propagates a third signal synchronized with the first signal from the first IC to the fourth IC. Transmission times of the first signal and the third signal are adjusted by forming a plurality of consecutive patterns, each having a pair of an inductance pattern and a capacitive pattern, at at least one of the first wiring pattern and the third wiring pattern.

According to a seventeenth of the present invention, a printed circuit board includes a first IC, and a second IC connected to the first IC by a first wiring pattern. The first wiring pattern propagates a first signal from the first IC to the second IC. The printing wiring board also includes a fifth IC connected to the second IC by a fourth wiring pattern. The fourth wiring pattern propagates a fourth signal from the fifth IC to the second IC. Transmission times of the first signal and the fourth signal are adjusted by forming a plurality of consecutive patterns, each having a pair of an inductance pattern and a capacitive pattern, at at least one of the first wiring pattern and the fourth wiring pattern.

The above and other objects of the invention will become more apparent from the following detailed description of the preferred embodiments taken in conjunction with the accompanying drawings.

DETAILED DESCRIPTION OF THE PREFERRED EMBODIMENTS

Figure 1:
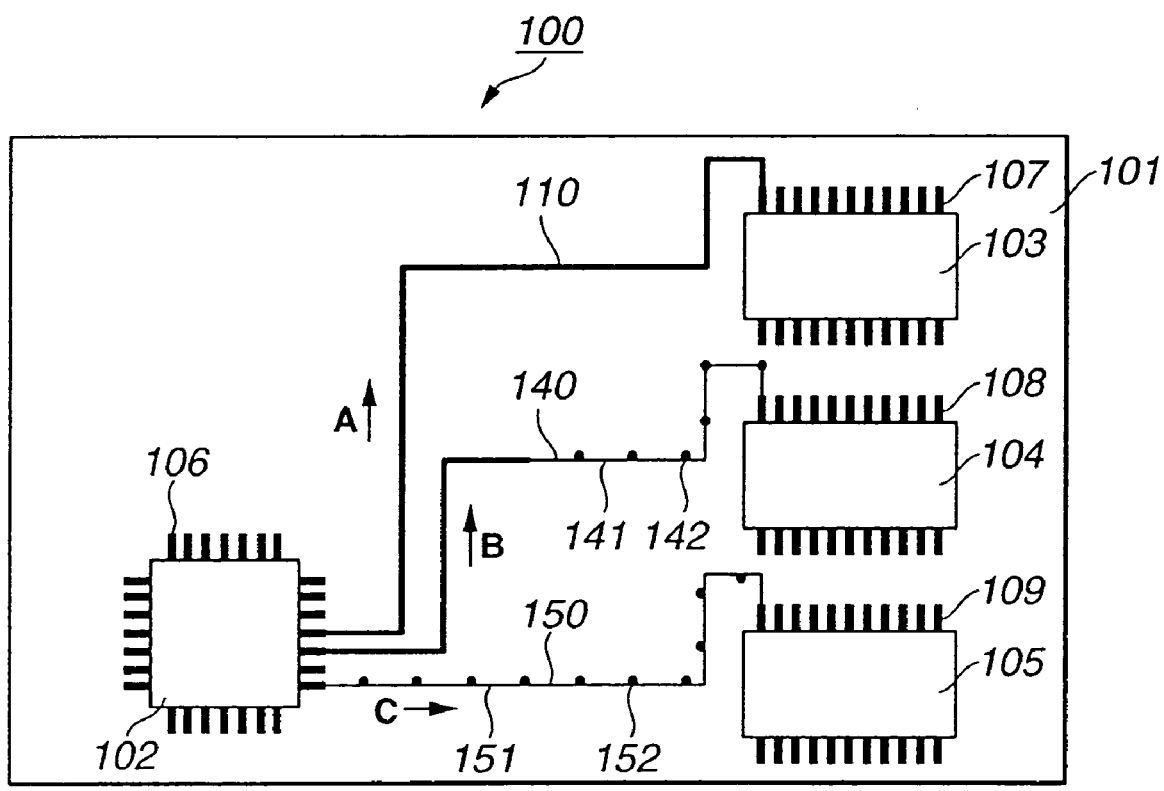
FIG. 1 is a schematic diagram illustrating a printed circuit board according to a first embodiment of the present invention.

First, the basic configuration of the present invention will be described.

A description will now be provided of a principle in which, in wiring patterns of a printed wiring board for interconnecting a plurality of IC's operating with synchronizing signals, by providing a wiring pattern formed by a plurality of consecutive pairs, each having an inductance pattern and a capacitive pattern, the signal propagation speed of a clock signal is adjusted.

In general, a propagation delay time $t_{pd}$ per unit length of a transmission line is expressed by the following equation (1):

$$t_{pd} = \sqrt{\epsilon_r}/Co \tag{1}$$

where $\epsilon_r$ is the dielectric constant of a substance surrounding the transmission line, and Co is the velocity of light.

Equation (1) can be used for a strip transmission line without modification. In the case of a micro-strip transmission line in which air is present at one side is air and a dielectric, such as a resin, is present at another side, however, an appropriate dielectric constant is used instead of the dielectric constant $\epsilon_r$.

The propagation delay time $t_{pd}$ can be expressed by the following equation (2) by using a line constant:

$$t_{pd} = \sqrt{(LC)} \tag{2}$$

where L is the value of inductance per unit length of the transmission line, and C is the value of capacitance per unit length of the transmission line.

The propagation velocity v of a signal at that time is the inverse of the propagation delay time $t_{pd}$, and can be expressed by the following equation (3):

$$v = 1/t_{pd} = \sqrt{(1/LC)} \tag{3}$$

As can be understood from equation (3), as the value of the inductance L of the inductance pattern and the value of the capacitance C of the capacitive pattern get larger, the signal propagation velocity gets smaller. Accordingly, by adjusting the inductance value L and the capacitance value C as a pair and providing the transmission line with the resultant pair as a load, the signal propagation velocity of the wiring pattern can be reduced.

However, when increasing the inductance value L and the capacitance value C, if a load including an extremely large inductance value and capacitance value is provided at part of wiring, impedance mismatching occurs, resulting in disturbance of a waveform. Sometimes, the waveform is greatly degraded at a rise portion and a fall portion. When the inductance value L and the capacitance value C are large, the wiring tends to behave like a lumped parameter circuit. Accordingly, it is difficult to simply estimate the transmission delay time as equation (3), and to adjust the inductance value L and the capacitance value C.

Accordingly, in order to secure the inductance value and the capacitance value necessary for adjusting the signal propagation velocity of the wiring pattern, it is necessary to arrange a plurality of consecutive pairs of inductance and capacitance having values smaller than specific values at an equal interval on the wiring pattern.

The specific values will now be described. An IC outputting a signal outputs in most cases a signal having a trapezoidal waveform. When the rise time from 10% to 90% of the maximum amplitude is represented by $t_r$, frequency components of frequencies exceeding $f=1/(\pi t_r)$ abruptly decrease with a ratio of –40 dB/decade ("Controlling Radiated Emissions by Design, Second Edition" by Michel Mardiguian, 2001, published by Kluwer Academic Publishers, p. 51).

According to the invention, in the waveform of the rise time $t_r$, it is only necessary to take into consideration of frequencies substantially up to $1/(\pi t_r)$. At higher frequencies, since the frequency component abruptly has a small value, the entire waveform is not greatly influenced by disturbance of waveforms.

Similarly, when the fall time from 90% to 10% of the maximum amplitude is represented by $t_f$, it is only necessary to take into consideration of frequencies substantially up to $1/(\pi t_f)$. At higher frequencies, since the frequency component abruptly has a small value, the entire waveform is not greatly influenced by disturbance of waveforms. Accordingly, when a smaller value of the rise time $t_r$ and the fall time $t_f$ is represented by time $t_s$, it is only necessary to take into consideration of frequencies substantially up to $1/(\pi t_s)$.

Frequency components having frequencies lower than $f=1/(\pi t_s)$ have large values. Accordingly, if there exists an unmatched portion of characteristic impedance over a length that is significant compared with the wavelength of that frequency, disturbance, such as degradation of the waveform, cannot be neglected. The unmatched portion that exists over a distance sufficiently short compared with the wavelength hardly influences the waveform. The distance sufficiently short compared with the wavelength indicates a length equal to or less than ⅛ of the wavelength corresponding to the frequency $f=1/(\pi t_s)$.

Accordingly, the above-described specific values indicates the inductance value and the capacitance value of a wiring pattern corresponding to the length of ⅛ of the wavelength corresponding to the frequency $f=1/(\pi t_s)$. If the inductance value. L and the capacitance value C of the pair of the inductance pattern and the capacitive pattern, respectively, are made smaller than these specific values, disturbance, such as degradation of the waveform, will not cause a problem.

However, for example, in the above-described case of a micro-strip transmission line in which air is present at one side and a dielectric, such as a resin, is present at another side, it is, of course, necessary to calculate a wavelength corresponding to the frequency $f=1/(\pi t_s)$ by taking into consideration the appropriate dielectric constant and permeability of a portion near the wiring pattern.

When adjusting the signal propagation velocity by adjusting the inductance value L of the inductance pattern and the capacitance value C of the capacitive pattern, it is necessary to perform matching of the characteristic impedance of each wiring pattern. If matching of the characteristic impedance is not performed between wiring patterns, a large distortion, such as ringing or the like, is generated in the waveform even if the signal propagation velocity is the same, resulting in incapability of normally operating respective IC's.

When the inductance value of the inductance pattern is represented by L, and the capacitance value of the capacitive pattern is represented by C, the characteristic impedance of the transmission line can be expressed by the following equation (4):

$$Z_0 = \sqrt{(L/C)} \qquad (4).$$

Accordingly, this characteristic impedance $Z_0$ and the characteristic impedance of another wiring pattern intended to have the same propagation velocity must be the same.

Next, a method for adjusting the signal propagation velocity and matching of the characteristic impedance will be specifically described with reference to the drawings.

First Embodiment

Figure 2:
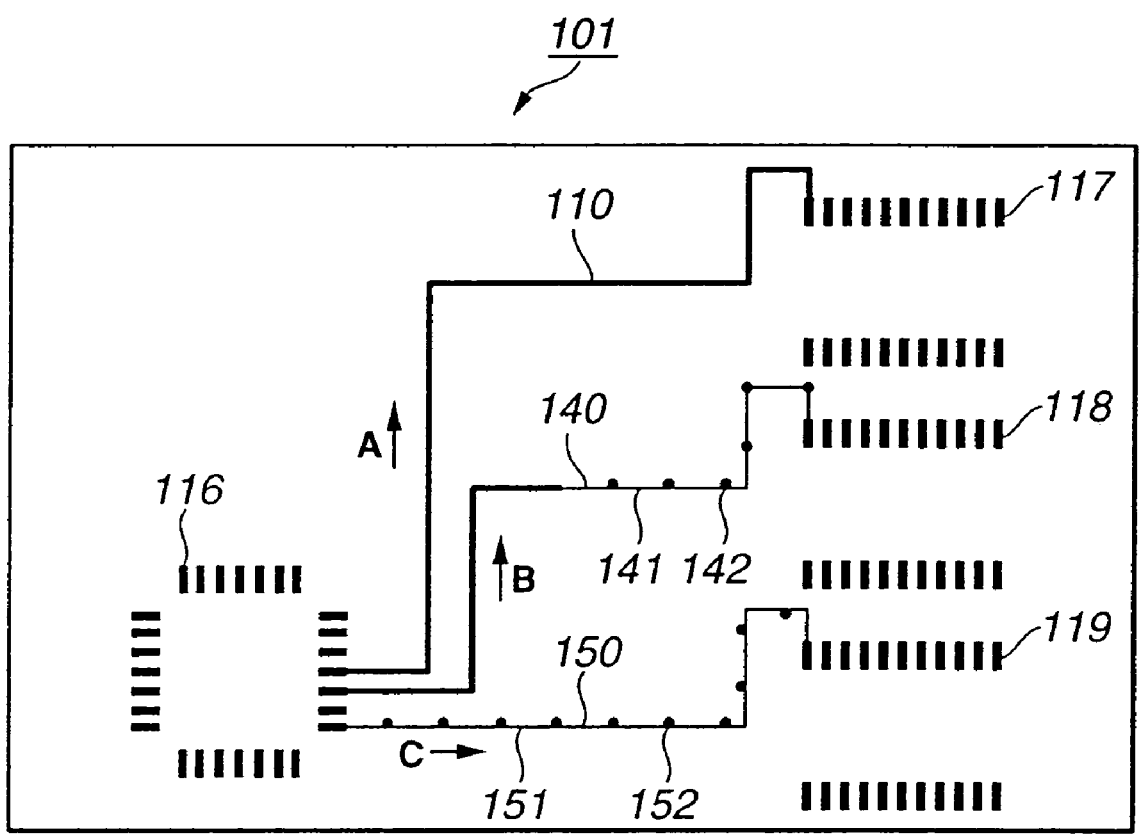
FIG. 2 is a schematic diagram illustrating a printed wiring board according to the first embodiment.
Figure 19:
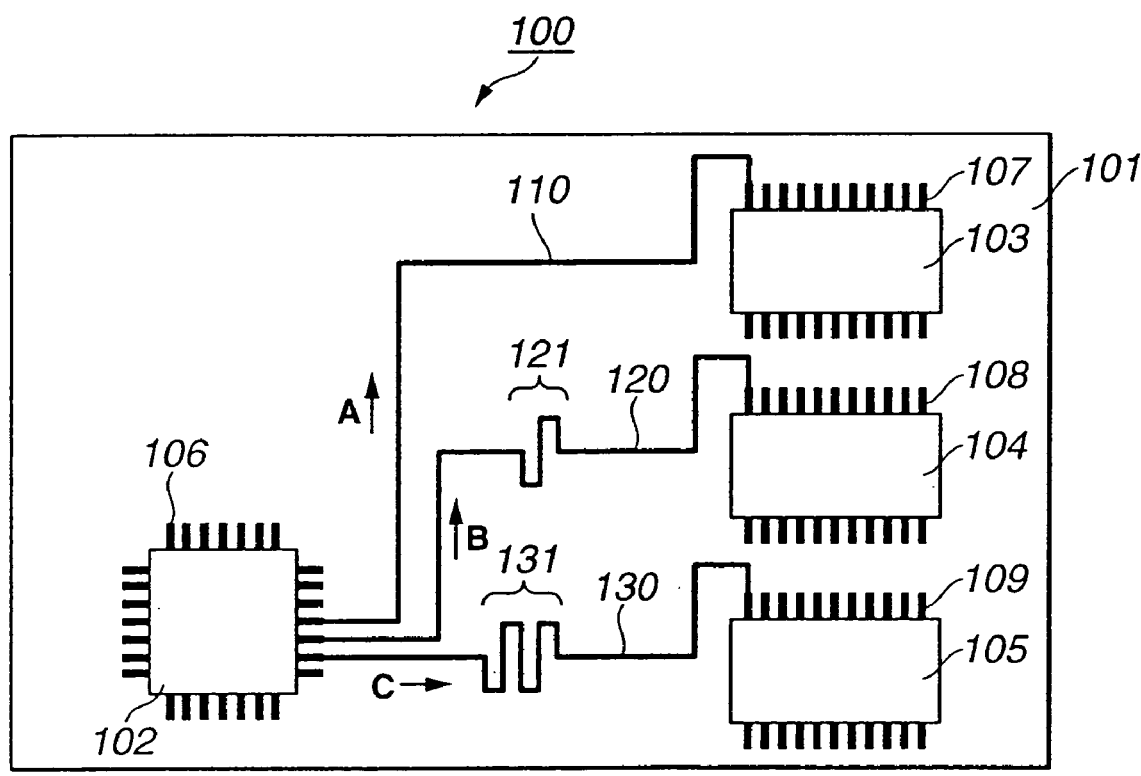
FIG. 19 is a diagram illustrating a conventional printed circuit board.

FIG. 1 illustrates a printed circuit board according to a first embodiment of the present invention. In FIG. 1, the same components as those in the conventional technique shown in FIG. 19 are indicated by the same reference numerals. FIG. 2 illustrates a printed wiring board in which IC's are not mounted on the printed circuit board shown in FIG. 1.

FIG. 1 depicts a printed circuit board 100. A clock-signal generator IC 102, and SDRAM ICs 103, 104 and 105 having the same electric characteristics are mounted on a printed wiring board 101. The clock-signal generator IC 102 is a quad flat package(QFP)-type IC and the SDRAM ICs 103, 104 and 105 are small outline package(SOP)-type ICs. Lead portions 106, 107, 108 and 109 of the respective ICs are bonded to lands 116, 117, 118 and 119 (see FIG. 2), respectively, of the printed wiring board 101 by soldering.

In this circuit, clock signals A, B and C are transmitted from the clock-signal generator IC 102 to the SDRAM ICs 103, 104 and 105 via wiring patterns 110, 140 and 150, respectively. The clock signals A, B and C are synchronizing signals, and the times of arrival of the clock signals A, B and C to the SDRAM ICs 103, 104 and 105, respectively, must be the same. Since the SDRAM ICs 103, 104 and 105 are arranged at positions more separated from the clock-signal generator IC 102 in this sequence because of mounting limitation, the lengths of the wiring patterns 110, 140 and 150 are longer in this sequence.

Figure 3:
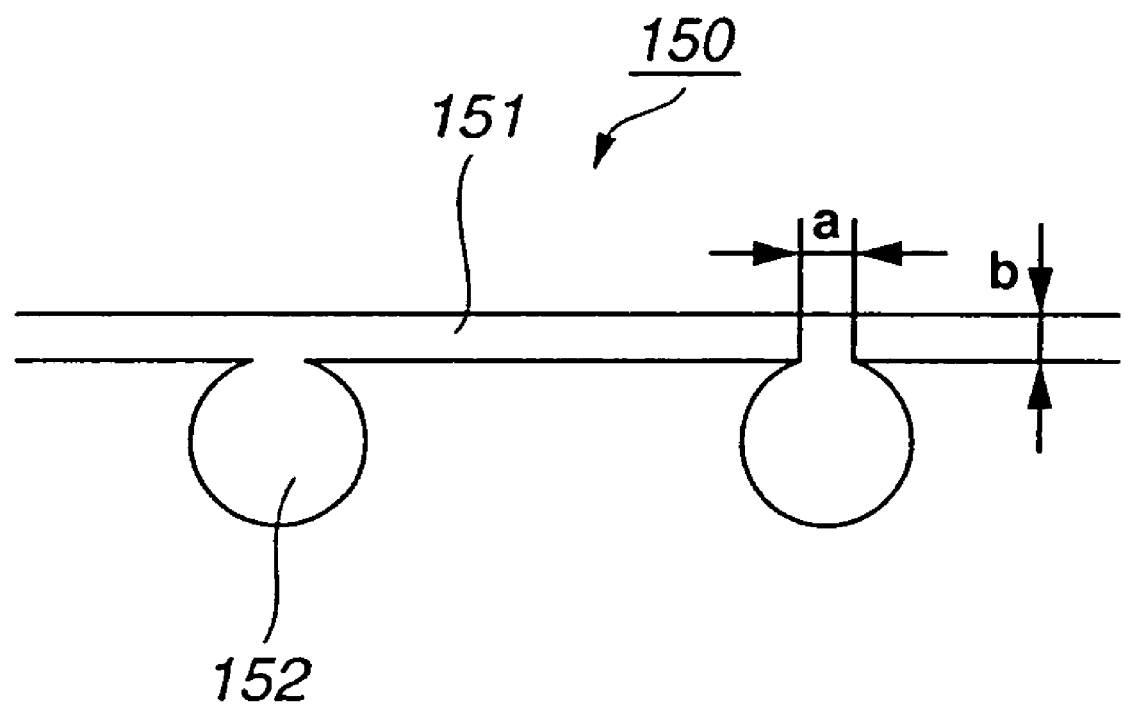
FIG. 3 is a diagram illustrating the shape of a wiring pattern in the first embodiment in detail.

FIG. 3 is a diagram illustrating the shape of the wiring pattern 150 in detail. A rectilinear inductance pattern 151 narrower than the wiring pattern 110 and a circular capacitive pattern 152 are formed at the wiring pattern 150. When the inductance pattern 151 and the capacitive pattern 152 constitute a pair, then, as shown in FIG. 1, ten pairs of the inductance pattern 151 and the capacitive pattern 152 are consecutively provided with an equal spacing. The inductance value L can be set by changing the length and the width of the inductance pattern 151. The capacitance value C can be adjusted by changing the radius of the circular capacitive pattern 152.

In order to make the inductance value L of the inductance pattern 151 and the capacitance value C of the capacitive pattern 152 sufficiently small, the width "a" of a portion where the capacitive pattern 152 contacts the inductance pattern 151 is made to be substantially equal to or less than the width b of the inductance pattern 151.

FIGS. 1 and 2 are schematic diagrams for facilitating the understanding of the present invention. In the actual printed circuit board 100, electronic components, such as other ICs, resistors, capacitors, connectors and the like, other than the ICs shown in FIGS. 1 and 2 are mounted. On the printed wiring board 101, other signal-line patterns, a power-supply pattern, a grounding pattern, through-holes and the like are also formed.

Operations of this circuit will now be more specifically described using an example. The rise time $t_r$ and the fall time $t_f$ of clock signals A, B and C (assumed to have a trapezoidal waveform) transmitted from the clock-signal generator IC 102 in a no-load state are $t_r$=0.500 nsec, and $t_f$=0.510 nsec. Accordingly, $t_s$=$t_f$=0.500 nsec, and $1/(\pi t_s)$ is calculated to be about 630 MHz. The wavelength corresponding to the frequency of 640 MHz is about 23.9 cm, and ⅛ of the wavelength is about 3.00 cm. The inductance and the capacitance of the wiring pattern corresponding to 3.00 cm are 10.5 nH and 3.60 pF, respectively.

The wiring pattern 110 has a microstrip-line structure, and has a width of 0.50 mm and a length of 9.00 cm. The inductance value L=3.50 nH/cm, the capacitance value C=1.20 pF/cm, and the propagation velocity is about $1.54 \times 10^5$ m/sec. Accordingly, transmission of the clock signal A from the clock-signal generator IC 102 to the SDRAM IC 104 in the wiring pattern 110 having the length of 9.00 cm requires about 0.584 ns. The characteristic impedance at that time is about 54.0 Ω according to equation (4).

The wiring pattern 140 has a microstrip-line structure having a length of 7.00 cm, and has the same pattern as the wiring pattern 110 up to a portion 4.00 cm from the memory controller IC 102, with a width of 0.50 mm and an inductance value L=3.50 nH/cm, and a capacitance value C=1.20 pF/cm. At the succeeding portion having a length of 3.00 cm up to the SDRAM IC 104, six pairs of a rectilinear narrow inductance pattern 141 having a width of 0.20 mm and a length of 0.50 cm, and a circular capacitive pattern 142 having a radius of 0.25 mm are provided with an equal interval. The inductance value L of the inductance pattern 141 and the capacitance value C of the capacitive pattern 142 are set to L=5.30 nH, and C=2.20 pF.

The signal propagation velocity in the wiring pattern 140 is about $1.54 \times 10^5$ m/sec at a portion up to 4 cm from the clock-signal generator IC 102, and about $0.906 \times 10^5$ m/sec at the succeeding portion of 3.00 cm up to the SDRAM IC 104. Accordingly, transmission of the clock signal B from the clock-signal generator IC 102 to the SDRAM IC 104 in the wiring pattern 140 having the length of 7 cm requires about 0.591 ns. The characteristic impedance at that time is about 54.0 Ω at a portion up to 4.00 cm from the clock-signal generator IC 102, and about 49.1 Ω at a portion of 3.00 cm up to the SDRAM IC 104, according to equation (4), and it can be considered that the difference is substantially constant in the wiring pattern 140.

The wiring pattern 150 has a microstrip-line structure having a length of 5.00 cm. In the entire wiring pattern 150, ten pairs of a rectilinear thin inductance pattern 151 having a width of 0.15 mm and a length of 0.50 cm, and a circular capacitive pattern 152 having a radius of 0.5 mm are provided with an equal interval. The inductance value L of the inductance pattern 151 and the capacitance value C of the capacitive pattern 152 are set to L=5.80 nH, and C=2.30 pF. The signal propagation velocity of the clock signal C in the wiring pattern 150 is about $0.867 \times 10^5$ m/sec based on the length of the rectilinear inductance pattern, according to equation (3). Accordingly, transmission of the clock signal C from the clock-signal generator IC 102 to the SDRAM IC 105 in the wiring pattern 150 having the length of 5.00 cm requires about 0.577 ns. The characteristic impedance at that time is about 50.0 Ω according to equation (4).

The signal transmission time of the clock signal A from the clock-signal generator IC 102 to the SDRAM IC 103 via the wiring pattern 110 is about 0.584 ns, the signal transmission time of the clock signal B from the clock-signal generator IC 102 to the SDRAM IC 104 via the wiring pattern 140 is about 0.591 ns, and the signal transmission time of the clock signal C from the clock-signal generator IC 102 to the SDRAM IC 105 via the wiring pattern 150 is about 0.577 ns. Accordingly, the signal transmission times of the clock signals A, B and C can be considered to be substantially the same, and very small differences among these transmission times will cause no problem for synchronizing signals. The characteristic impedance of the wiring pattern 110 is 54.0 Ω, the characteristic impedance of the wiring pattern 140 is 49.1 Ω and 54.0 Ω, and the characteristic impedance of the wiring pattern 150 is 50.0 Ω. Accordingly, the characteristic impedance values of the respective wiring patterns are substantially the same, and very small differences among these characteristic impedance values will cause no problem for synchronizing signals.

The inductance value and the capacitance value of the wiring pattern 140 are 5.30 nH≦10.5 nH, and 2.20 pF≦3.60 pF, respectively, i.e., values much smaller than values corresponding to ⅛ of the wavelength for the frequency of 640 MHz. Similarly, the inductance value and the capacitance value of the wiring pattern 150 are 5.80 nH≦10.5 nH, and 2.30 pF≦3.60 pF, respectively, i.e., values much smaller than values corresponding to ⅛ of the wavelength for the frequency of 640 MHz. Accordingly, even if the respective pairs of the rectilinear narrow inductance pattern 141 and the capacitive pattern 142, and the inductance pattern 151 and the capacitive pattern 152 are unmatched portions of the wiring patterns 140 and 150, respectively, large waveform distortion will not occur.

In the first embodiment, although reference numeral 102 represents the clock-signal generator, and a signal propagated in each of the wiring patterns 110, 140 and 150 is a clock signal. However, reference numeral 102 may represent a memory controller, and a signal propagated in each of the wiring patterns 110, 140 and 150 may be a data signal.

As described above, the clock signals can substantially simultaneously reach in a state in which, for example, degradation of the waveform is negligible, even if the lengths of the wiring patterns differ.

Since the characteristic impedance values of the wiring patterns 110, 140 and 150 are very close, the characteristic impedance values of signal patterns are also matched, and distortion in the waveform, such as ringing, can be minimized.

Second Embodiment

Figure 4:
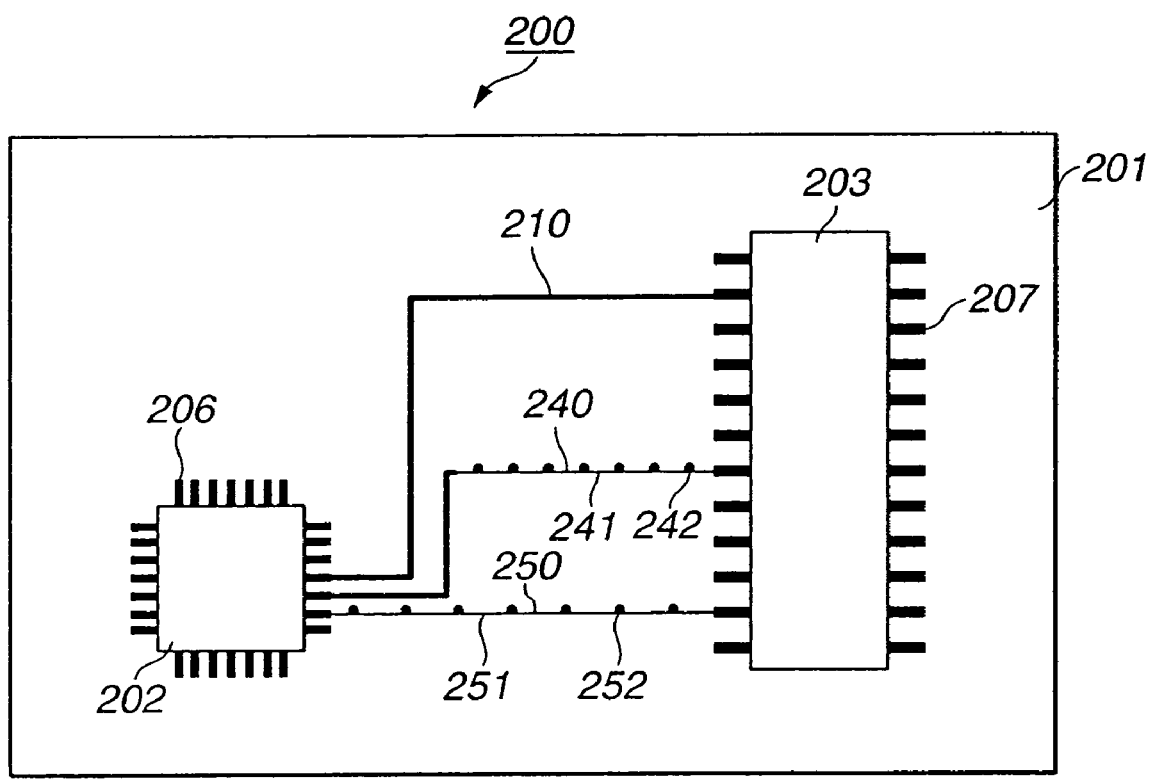
FIG. 4 is a schematic diagram illustrating a printed circuit board according to a second embodiment of the present invention.
Figure 5:
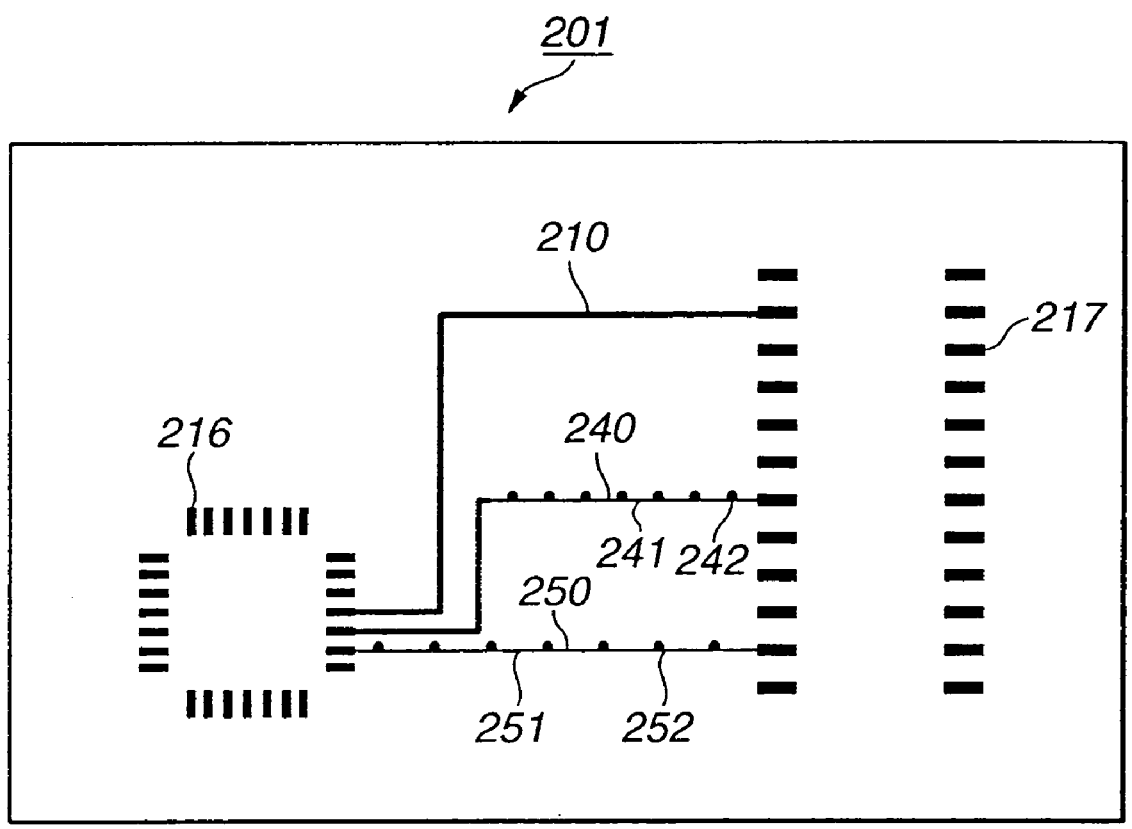
FIG. 5 is a schematic diagram illustrating a printed wiring board according to the second embodiment.
Figure 20:
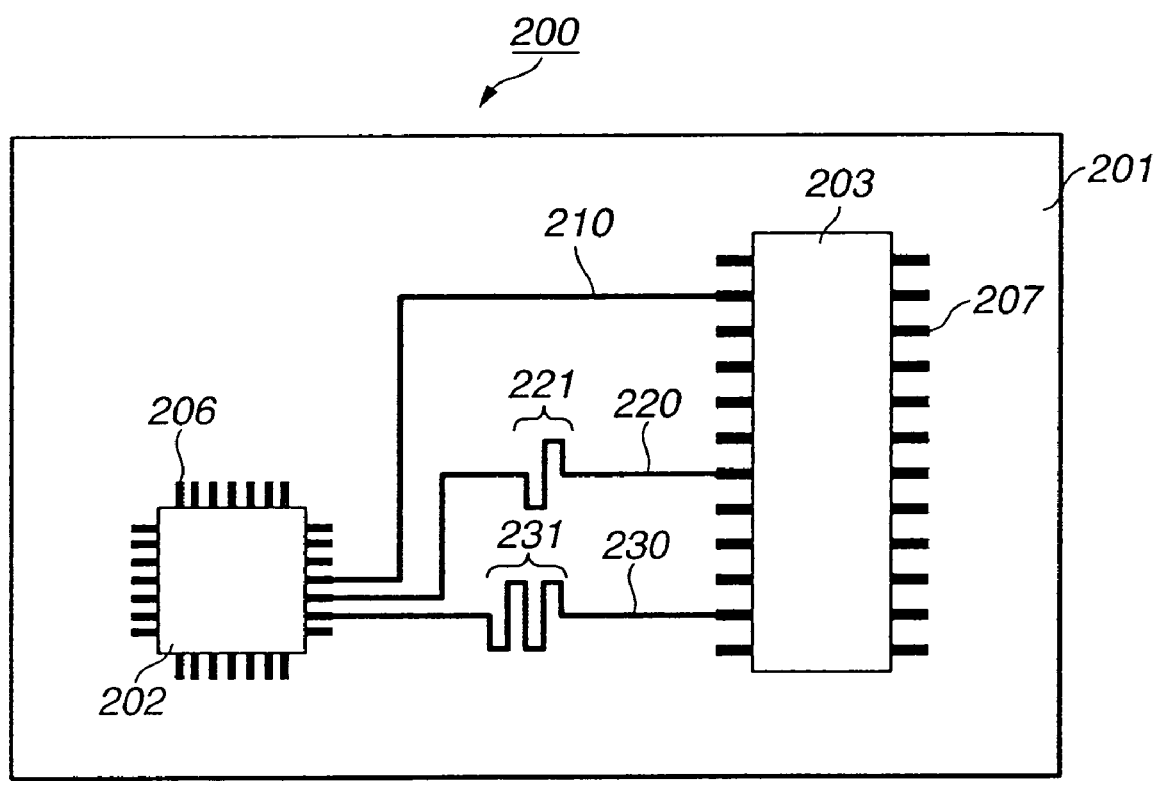
FIG. 20 is a diagram illustrating a conventional printed circuit board.

FIG. 4 illustrates a printed circuit board according to a second embodiment of the present invention. In FIG. 4, the same components as those in the conventional technique shown in FIG. 20 are indicated by the same reference numerals. FIG. 5 illustrates a printed wiring board in which IC's are not mounted on the printed circuit board shown in FIG. 4.

FIG. 4 depicts a printed circuit board 200. A memory controller IC 102 and a SDRAM IC 203 are mounted on a printed wiring board 201. The memory controller IC 202 is a QFP-type IC, and the SDRAM IC 203 is a SOP-type IC. Lead portions 206 and 207 of the respective ICs are bonded to lands 216 and 217 (see FIG. 5), respectively, of the printed wiring board 201 by soldering.

The memory controller IC 202 and the SDRAM IC 203 are connected by a bus wiring pattern, through which a bus signal is transmitted from the memory controller IC 202 to the SDRAM IC 203. In FIGS. 4 and 5, only three wiring patterns 210, 240 and 250 of the bus wiring pattern are shown, and other wiring patterns are omitted.

The lengths of the wiring patterns 210, 240 and 250 are longer in this sequence. Accordingly, pairs of an inductance pattern 241 and a capacitive pattern 242 are formed at part of the wiring pattern 240 with an equal interval. In the entire wiring pattern 250, pairs of the inductance pattern 251 and the capacitive pattern 252 are formed with an equal interval. The wiring pattern 210 is an ordinary wiring pattern in which pairs of the inductance pattern and the capacitive pattern are not formed.

FIGS. 4 and 5 are schematic diagrams for facilitating the understanding of the second embodiment. In the actual printed circuit board 100, electronic components, such as other ICs, resistors, capacitors, connectors and the like, other than the ICs shown in FIGS. 4 and 5 are mounted. On the printed wiring board 101, other signal-line patterns, a power-supply pattern, a grounding pattern, through-holes and the like are also formed.

Operations of this circuit will now be more specifically described using an example. The rise time $t_r$ and the fall time $t_f$ of a bus signal (assuming to have a trapezoidal waveform) transmitted from the memory controller IC 202 in a no-load state are $t_r=0.400$ nsec, and $t_f=0.420$ nsec. Accordingly, $t_s=t_r=0.400$ nsec, and $1/(\pi t_s)$ is calculated to be about 800 MHz. The wavelength corresponding to the frequency of 800 MHz is about 19.1 cm, and ⅛ of the wavelength is about 2.40 cm. The inductance and the capacitance of the wiring pattern corresponding to 2.40 cm are 8.40 nH and 2.90 pF, respectively.

The wiring pattern 210 has a microstrip-line structure, and has a width of 0.50 mm and a length of 12.00 cm. The inductance value L=3.00 nH/cm, the capacitance value C=1.00 pF/cm, and the propagation velocity v=1.83×10$^5$ m/sec. Accordingly, transmission of a digital signal from the memory controller IC 202 to the SDRAM IC 203 in the wiring pattern 210 having the length of 12 cm requires about 0.658 ns. The characteristic impedance at that time is about 54.8 Ω according to equation (4).

The wiring pattern 240 has a microstrip-line structure having a length of 8.00 cm, and has the same pattern as the wiring pattern 210 up to a portion 4.00 cm from the memory controller IC 202, with a width of 0.50 mm and an inductance value L=3.00 nH/cm, and a capacitance value C=1.00 pF/cm. At the succeeding portion having a length of 4.00 cm up to the SDRAM IC 203, five pairs of a rectilinear narrow inductance pattern 241 having a width of 0.20 mm and a length of 0.50 cm, and a circular capacitive pattern 242 having a radius of 0.25 mm are provided with an equal interval. The inductance value L of the inductance pattern 241 and the capacitance value C of the capacitive pattern 242 are set to L=5.30 nH, and C=2.20 pF.

The signal propagation time in the wiring pattern 240 is about 1.83×10$^5$ m/sec at a portion up to 4.00 cm from the memory controller IC 202, where pairs of the inductance pattern 241 and the capacitive pattern 242 are provided, and about 0.906×10$^5$ m/sec at the succeeding portion of 4.00 cm up to the SDRAM IC 203. Accordingly, transmission of the bus signal from the memory controller IC 202 to the SDRAM IC 203 in the wiring pattern 240 having the length of 8.00 cm requires about 0.660 ns. The characteristic impedance at that time is about 54.8 Ω at a portion up to 4.00 cm from the memory controller IC 202, and about 49.1 Ω at a portion of 4.00 cm up to the SDRAM IC 203, according to equation (4), and it can be considered that the difference is substantially constant in the wiring pattern 240.

The wiring pattern 250 has a microstrip-line structure having a length of 6.00 cm. In the entire wiring pattern 250, seven pairs of a rectilinear inductance pattern 251 having a width of 0.20 mm and a length of 0.86 cm, and a circular capacitive pattern 252 having a radius of 0.20 mm are provided with an equal interval. The inductance value L of the inductance pattern 251 and the capacitance value C of the capacitive pattern 252 are set to L=5.70 nH, and C=2.10 pF. The signal propagation velocity of the bus signal in the wiring pattern 250 is about 0.914×10$^5$ m/sec based on the length of the rectilinear inductance pattern, according to equation (3). Accordingly, transmission of the bus signal from the memory controller IC 202 to the SDRAM IC 203 in the wiring pattern 250 having the length of 6.00 cm requires about 0.656 ns. The characteristic impedance at that time is about 52.1 Ω according to equation (4).

The propagation times of signals from the memory controller IC 202 to the SDRAM IC 203 via the wiring pattern 210, the wiring pattern 240 and the wiring pattern 250 are about 0.658 ns, about 0.660 ns and about 0.656 ns, respectively, that are substantially the same. Very small differences among these signal propagation times will cause no problem for synchronizing signals. The characteristic impedance of the wiring pattern 210 is 54.8 Ω, the characteristic impedance of the wiring pattern 240 is 54.8 Ω and 54.0 Ω, and the characteristic impedance of the wiring pattern 250 is 52.1 Ω. Accordingly, the characteristic impedance values of the respective wiring patterns are substantially the same, and very small differences among these characteristic impedance values will cause no problem for synchronizing signals.

The inductance value and the capacitance value of the wiring pattern 240 are 5.30 nH≦8.40 nH, and 2.20 pF≦2.90 pF, respectively, i.e., values much smaller than values corresponding to ⅛ of the wavelength for the frequency of 640 MHz. Similarly, the inductance value and the capacitance value of the wiring pattern 250 are 5.70 nH≦8.40 nH, and 2.10 pF≦2.90 pF, respectively, i.e., values much smaller than values corresponding to ⅛ of the wavelength for the frequency of 640 MHz. Accordingly, even if the respective pairs of the rectilinear narrow inductance pattern 241 and the capacitive pattern 242, and the inductance pattern 251 and the capacitive pattern 252 are unmatched portions of the wiring patterns 240 and 250, respectively, large waveform distortion will not occur.

As described above, according to the second embodiment, by providing pairs of an inductance pattern and a capacitive pattern in the bus wiring pattern, when propagating clock signals from the memory controller IC 102 to the SDRAM IC 203 via the wiring patterns 210, 240 and 250 of the bus wiring pattern, the clock signals can almost simultaneously reach in a state in which, for example, degradation in the waveform is only negligibly produced, even if the lengths of the wiring patterns differ. Therefore skew is minimized.

Since the characteristic impedance values of the wiring patterns 210, 240 and 250 are very close, the characteristic impedance values of signal patterns are also matched, and distortion in the waveform, such as ringing or the like, can be minimized.

Third Embodiment

Figure 6:
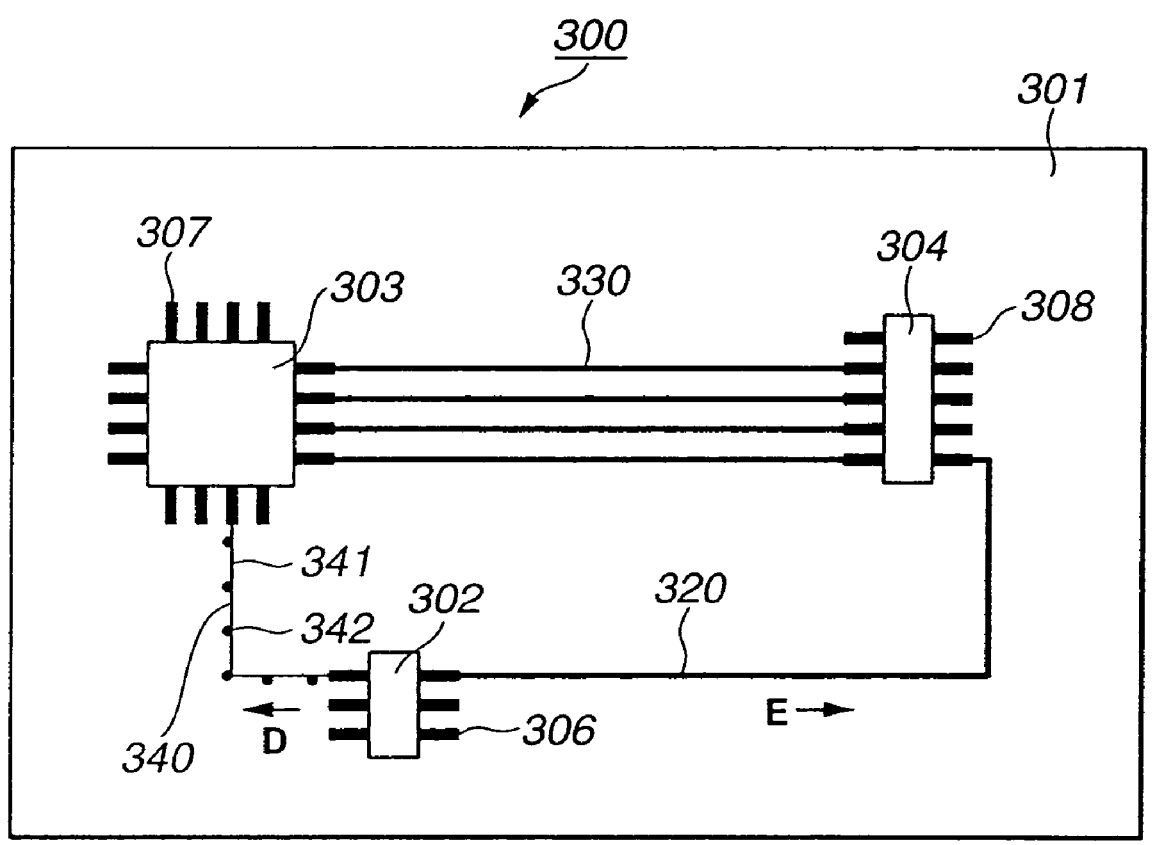
FIG. 6 is a schematic diagram illustrating a printed circuit board according to a third embodiment of the present invention.
Figure 7:
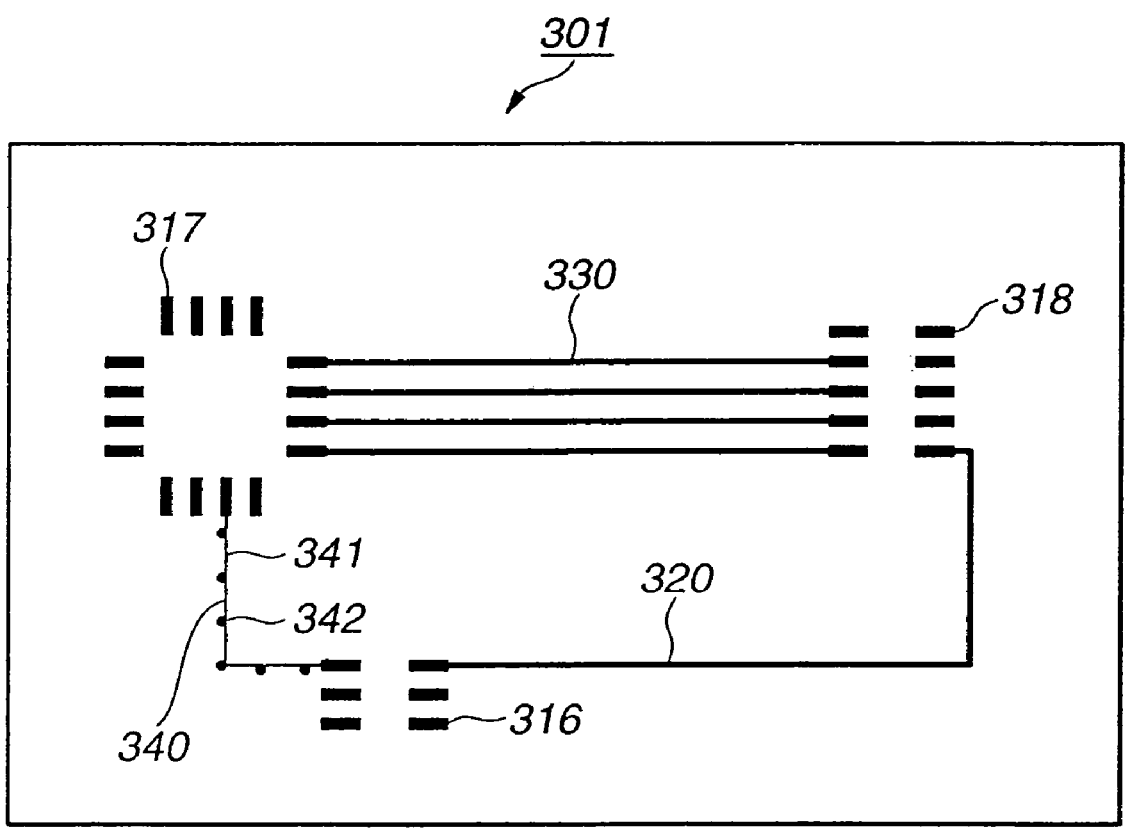
FIG. 7 is a schematic diagram illustrating a printed wiring board according to the third embodiment.
Figure 21:
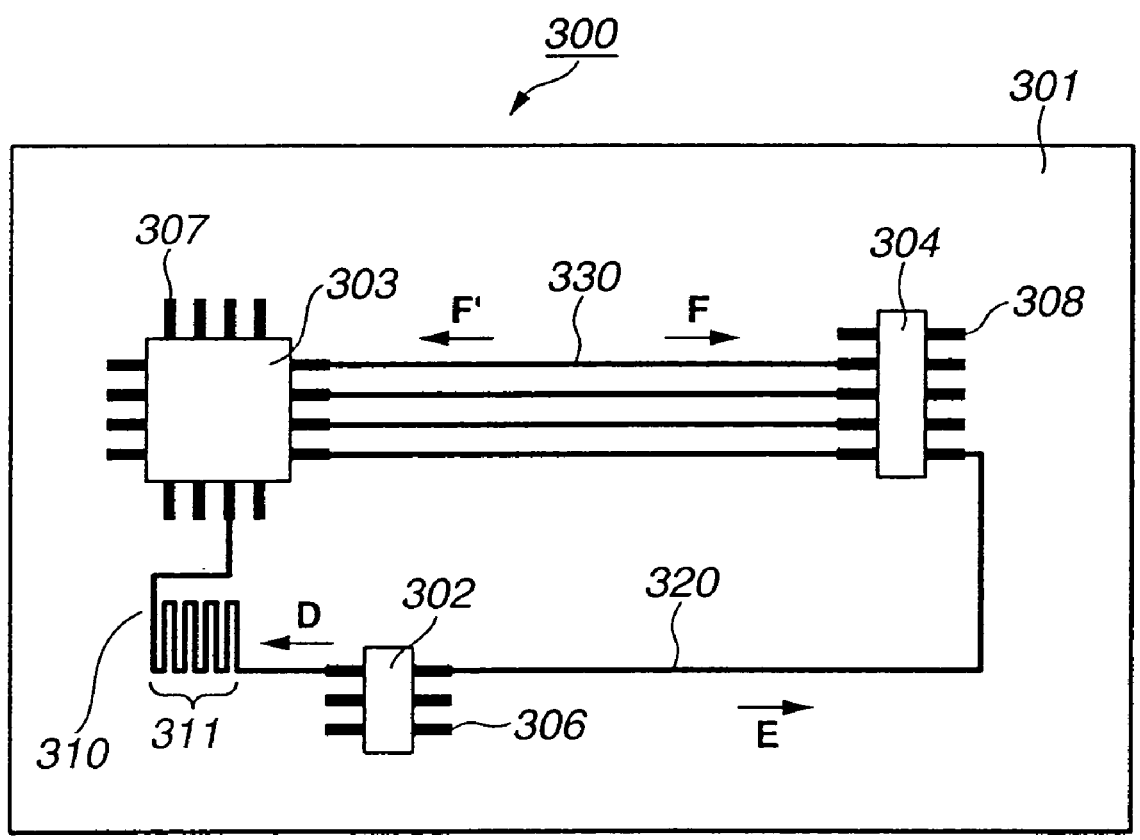
FIG. 21 is a diagram illustrating a conventional printed circuit board.

FIG. 6 illustrates a printed circuit board according to a third embodiment of the present invention. In FIG. 6, the same components as those in the conventional art, shown in FIG. 21, are indicated by the same reference numerals. FIG. 7 illustrates a printed wiring board in which IC's are not mounted on the printed circuit board shown in FIG. 6.

FIG. 6 depicts a printed circuit board 300. A clock-signal generator IC 302, a memory controller IC 303 and an SDRAM IC 304 are mounted on a printed wiring board 301. The clock-signal generator IC 302 and the SDRAM IC 304 are SOP-type ICs, and the memory controller IC 303 is a QFP-type IC. Lead portions 306, 307 and 308 of the respective ICs are bonded to lands 316, 317 and 318 (see FIG. 7), respectively, of the printed wiring board 301 by soldering.

In this circuit, a clock signal D and a clock signal E are transmitted from the clock-signal generator IC 302 to the memory controller IC 303 and the SDRAM IC 304 by a wiring pattern 340 and a wiring pattern 320, respectively. The memory controller IC 303 and the SDRAM IC 304 are connected by a bus wiring pattern 330. During data writing into the SDRAM IC 304, the memory controller IC 303 transmits a bus signal F to the SDRAM IC 304 via the bus wiring pattern 330 using a clock signal D. During data reading from the SDRAM IC 304, the SDRAM IC 304 transmits a bus signal F' to the memory controller IC 303 via the bus wiring pattern 330 using a clock signal E. The clock-signal generator IC 302 is disposed at a position nearer the memory controller IC 303 than the SDRAM IC 304 because of limitation in mounting. Hence, the wiring pattern 340 is considerably shorter than the wiring pattern 320.

In this high-speed circuit, it is desirable for the clock signal E to be transmitted from the clock-signal generator IC 302 to the SDRAM IC 304 and the data signal F to be transmitted from the memory controller IC 303 to the SDRAM IC 304 and to simultaneously reach the SDRAM IC 304. Similarly, it is desirable for the clock signal D transmitted from the clock-signal generator IC 302 to the memory controller IC 303 and the data signal F' to be transmitted from the SDRAM IC 304 to the memory controller IC 303, and to simultaneously reach the memory controller IC 303.

Accordingly, in such two-way transmission, if the input/output DC and AC characteristics of the clock-signal generator IC 302 and the SDRAM IC 304 are identical, it is desirable for the signal transmission time to the memory controller IC 303 be the same for the clock signals D and E. If the input/output DC and AC characteristics of the clock-signal generator IC 302 and the SDRAM IC 304 differ, the signal transmission time must be adjusted depending on the amount of difference in time.

A rectilinear inductance pattern 341 narrower than the wiring pattern 320 and a circular capacitive pattern 342 are formed in the wiring pattern 340. When the inductance pattern 341 and the capacitive pattern 342 constitute a pair, then, as shown in FIG. 6, six pairs of the inductance pattern 341 and the capacitive pattern 342 are consecutively provided with an equal interval. The inductance value can be adjusted by changing the length and the width of the inductance pattern 341. The capacitance value can be adjusted by changing the radius of the circular capacitive pattern 342.

FIGS. 6 and 7 are schematic diagrams for facilitating the understanding of the present invention. In the actual printed circuit board 100, electronic components, such as other ICs, resistors, capacitors, connectors and the like, other than the ICs shown in FIGS. 6 and 7 are mounted. On the printed wiring board 101, other signal-line patterns, a power-supply pattern, a grounding pattern, through-holes and the like are also formed.

First, an example will be specifically provided of a case in which the input/output DC and AC characteristics of the memory controller IC 303 and the SDRAM IC 304 are identical, and the signal transmission time to the memory controller IC 303 is adjusted to be the same for the clock signals D and E.

The rise time $t_r$ and the fall time $t_f$ of clock signals D and E (assumed to have a trapezoidal waveform) transmitted from the clock-signal generator IC 302 in a no-load state are $t_r$=0.500 nsec, and $t_f$=0.510 nsec. Accordingly, $t_s$=$t_r$=0.500 nsec, and $1/(\pi t_s)$ is calculated to be about 640 MHz. The wavelength corresponding to the frequency of 640 MHz is about 23.9 cm, and ⅛ of the wavelength is about 3.0 cm. The inductance and the capacitance of the wiring pattern corresponding to 3.0 cm are 10.5 nH and 3.60 pF, respectively. For 1/16 of the wavelength, the inductance and the capacitance of the wiring pattern are 5.25 nH and 1.80 pF, respectively.

In the printed wiring board 301, the wiring pattern 320 has a microstrip-line structure, and has a width of 0.50 mm and a length of 10.00 cm. In the wiring pattern 320, the inductance value L=3.50 nH/cm, and the capacitance value C=1.20 pF/cm. The propagation velocity of the clock signal in this transmission line is about $1.54 \times 10^5$ m/sec. This value is about 51.3% of the value in a vacuum, i.e., about ½ of the value in a vacuum. Accordingly, transmission of the clock signal from the clock-signal generator IC 302 to the SDRAM IC 304 in the wiring pattern 340 having the length of 10.00 cm requires about 0.648 ns. The characteristic impedance at that time is about 54.0 Ω according to equation (4).

The wiring pattern 350 has a microstrip-line structure having a length of 6.00 cm, and six pairs of a rectilinear inductance pattern 341 narrower than the wiring pattern 320, having a width of 0.25 mm and a length of 1.00 cm, and a circular capacitive pattern 342 having a radius of 0.25 mm are provided with an equal interval. The inductance value L of the inductance pattern 341 and the capacitance value C of the capacitive pattern 342 are set to L=5.30 nH, and C=2.20 pF.

The inductance value and the capacitance value of the wiring pattern 350 are 5.30 nH≦10.5 nH, and 2.20 pF≦3.60 pF, respectively, i.e., values much smaller than values corresponding to ⅛ of the wavelength for the frequency of 640 MHz. Accordingly, even if the respective pairs of the rectilinear narrow inductance pattern 341 and the capacitive pattern 342 are unmatched portions of the wiring pattern 350, large waveform distortion will not occur.

The signal propagation velocity of the clock signal in the wiring pattern 340 is about $0.906 \times 10^5$ m/sec based on the length of the rectilinear inductance pattern, according to equation (3). Accordingly, transmission of the clock signal from the clock-signal generator IC 302 to the memory controller IC 303 in the wiring pattern 340 having a length of 6.00 cm requires about 0.662 ns. This value is substantially equal to the velocity of 0.648 ns transmitted from the clock-signal generator IC 302 to the SDRAM IC 304 in the wiring pattern 340, and the difference between the velocities will cause no problem for a synchronizing signal. The characteristic impedance at that time is about 49.1 Ω according to equation (4). This value is substantially equal to the characteristic impedance 54.0 Ω of the wiring pattern 320, and the difference between the two values will cause no problem for a synchronizing signal.

Next, an example will be provided of a case in which the input/output DC and AC characteristics of the clock-signal generator IC 302 and the SDRAM IC 304 differ, and the difference between a delay time until the data signal F is transmitted from the memory controller IC 303 to the SDRAM IC 304 after the clock signal D has reached the memory controller IC 303, and a delay time until the bus signal F' is transmitted from the SDRAM IC 304 to the memory controller IC 303 after the clock signal E has reached the memory SDRAM IC 304 is 0.060 ns.

In this case, by making the signal transmission time of the clock signal D to the memory controller IC 303 smaller than the signal transmission time of the clock signal E to the memory controller IC 303 by 0.060 ns, the clock signal E transmitted from the clock-signal generator IC 302 to the SDRAM IC 304, the data signal F transmitted from the memory controller IC 303 to the SDRAM IC 304, the clock signal D transmitted from the SDRAM IC 304 to the clock-signal generator IC 302, and the bus signal F transmitted from the SDRAM IC 304 to the memory controller IC 303 can operate in a synchronized state.

In the wiring pattern 340, by increasing the width of the inductance pattern 341 from 0.25 mm to 0.30 mm, the inductance value is changed from 5.30 nH to 4.90 nH. By reducing the diameter of the circular capacitive pattern 342 from 0.25 mm to 0.20 mm, the capacitance value is changed from 2.20 pF to 2.00 pF. As a result, the signal propagation velocity in the wiring pattern 340 becomes about $1.01 \times 10^5$ m/sec. Accordingly, propagation of the clock signal D from the clock-signal generator IC 302 to the memory controller IC 303 by the wiring pattern 340 having the length of 6.00 cm requires about 0.594 ns. This value is smaller than the time of propagation of the clock signal E from the clock-signal generator IC 302 to the SDRAM IC 304 by the wiring pattern 320 of 0.662 ns by 0.068 ns. Hence, the difference between times of arrival of the clock signal E and the bus signal F and the clock signal D and the bus signal F' to the SDRAM IC 304 is 0.008 ns. This value will cause no problem for a synchronizing signal.

The characteristic impedance of the wiring pattern 340 at that time is 49.5 Ω according to equation (4). This value is substantially equal to the characteristic impedance of 54.0 Ω of the wiring pattern 320, and the difference between the two values will cause no problem for a synchronizing signal.

As described above, according to the third embodiment, by providing pairs of an inductance pattern and a capacitive pattern in the wiring pattern, when outputting the clock signals D and E from the clock-signal generator IC 302 to the memory controller IC 303 and the SDRAM IC 304 via the wiring pattern 340 and the wiring pattern 320, respectively, outputting the bus signal F from the memory controller IC 303 to the SDRAM IC 304, and outputting the bus signal F from the SDRAM IC 304 to the memory controller IC 303 via the wiring pattern 330, the clock signals D and E can almost simultaneously reach in a state in which, for example, degradation in the waveform is negligible, even if the lengths of the wiring patterns 320 and 340 differ, and therefore skew can be minimized. It is thereby possible to propagate the clock signal E and the bus signal F to the SDRAM IC 304 in a synchronized state, and propagate the clock signal D and the bus signal F' to the memory controller IC 303 in a synchronized state. By adjusting the signal propagation velocity by changing the inductance value and the capacitance value, the signal transmission time can be adjusted. Even if a signal delays due to a difference in electric characteristics, such as AC characteristics, DC characteristics and the like, between the memory controller IC 303 and the SDRAM IC 304, it is possible to propagate the clock signal E and the bus signal F to the SDRAM IC 304 in a synchronized state, and propagate the clock signal D and the bus signal F' to the memory controller IC 303 in a synchronized state.

Since the characteristic impedance values of the wiring pattern 320 and the wiring pattern 340 are very close, the characteristic impedance values of signal patterns are also matched, and distortions in the waveform, such as ringing, can be minimized.

Fourth Embodiment

Figure 8:
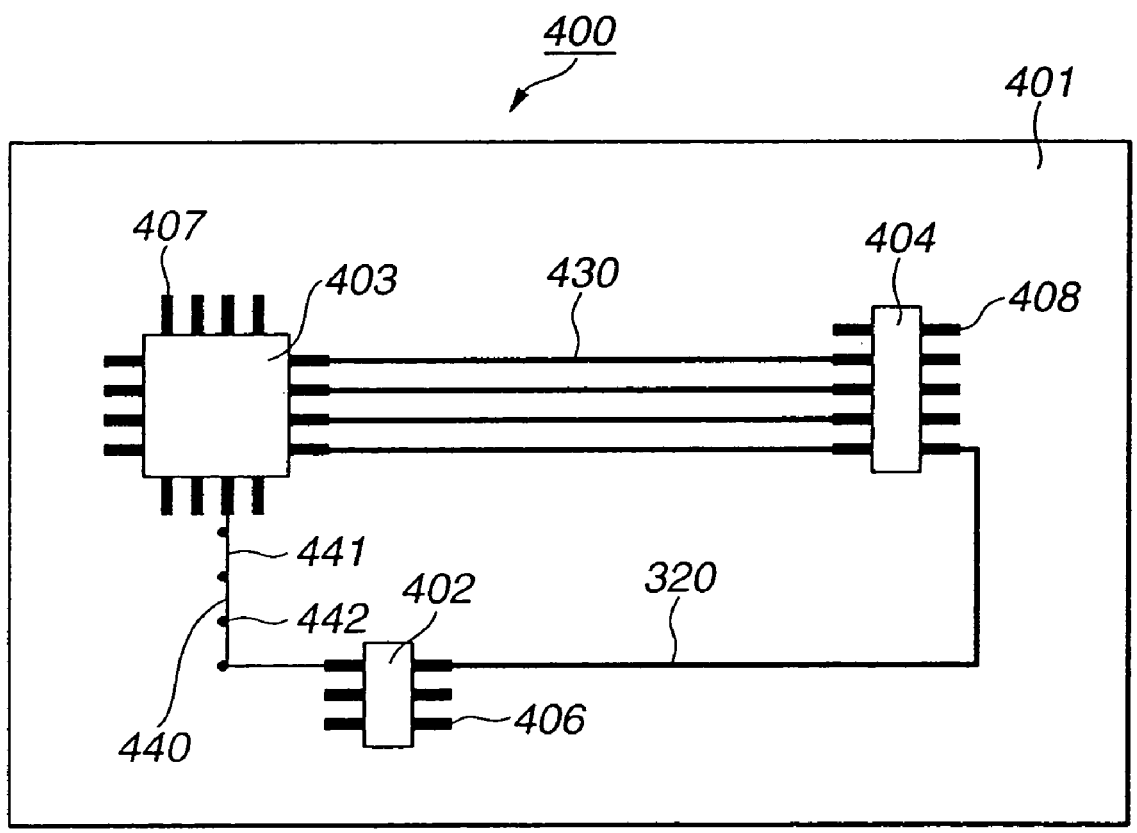
FIG. 8 is a schematic diagram illustrating a printed circuit board according to a fourth embodiment of the present invention.
Figure 9:
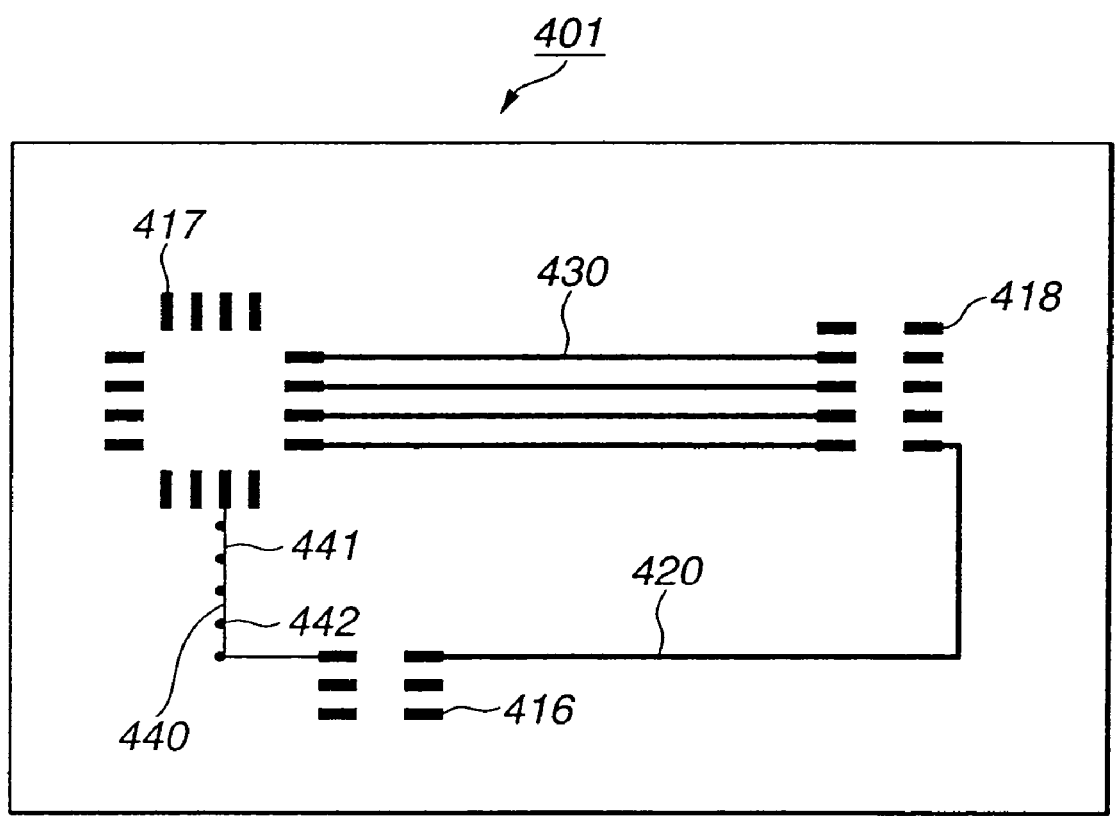
FIG. 9 is a schematic diagram illustrating a printed wiring board according to the fourth embodiment.

FIG. 8 illustrates a printed circuit board 400 according to a fourth embodiment of the present invention. FIG. 9 illustrates a printed wiring board in which IC's are not mounted on the printed circuit board shown in FIG. 8.

In FIG. 8, there is shown a printed circuit board 400. A clock-signal generator IC 402, a memory controller IC 403 and an SDRAM IC 404 are mounted on a printed wiring board 401. The clock-signal generator IC 402 and the SDRAM IC 404 are SOP-type ICs, and the memory controller IC 403 is a QFP-type IC. Lead portions 406, 407 and 408 of the respective ICs are bonded to lands 416, 417 and 418 (see FIG. 9), respectively, of the printed wiring board 401 by soldering.

In this circuit, a clock signal G and a clock signal H are transmitted from the clock-signal generator IC 402 to the memory controller IC 403 and the SDRAM IC 404 by a wiring pattern 440 and a wiring pattern 420, respectively. The memory controller IC 403 and the SDRAM IC 404 are connected by a bus wiring pattern 430. During data writing into the SDRAM IC 404, the memory controller IC 403 transmits a bus signal I to the SDRAM IC 404 via the bus wiring pattern 430 using a clock signal G. During data reading from the SDRAM IC 404, the SDRAM IC 404 transmits a bus signal I' to the memory controller IC 403 via the bus wiring pattern 430 using a clock signal E. The clock-signal generator IC 402 is disposed at a position nearer the memory controller IC 403 than the SDRAM IC 404 because of mounting limitations. Hence, the wiring pattern 440 is considerably shorter than the wiring pattern 420.

Although the clock-signal generator IC 402 is disposed at a portion near the memory controller IC 403 because of mounting limitation, it is not as close to the memory controller IC 403 as in the third embodiment. Accordingly, the difference in the wiring length between the wiring pattern 440 and the wiring pattern 420 is smaller than in the third embodiment. Hence, by providing five pairs of a rectilinear narrow inductance pattern 441 and a capacitive pattern 442 only at part of the wiring pattern 440 with an equal interval, the signal propagation velocity can be adjusted.

First, an example is provided of a case in which the input/output DC and AC characteristics of the memory controller IC 403 and the SDRAM IC 404 are identical, and the signal transmission time to the memory controller IC 403 is adjusted to be the same for the clock signals G and H.

The rise time $t_r$ and the fall time $t_f$ of the clock signal H transmitted from the clock-signal generator IC 402 in a no-load state are $t_r$=0.500 nsec, and $t_f$=0.510 nsec. Accordingly, $t_s$=$t_r$=0.500 nsec, and $1/(\pi t_s)$ is calculated to be about 640 MHz. The wavelength corresponding to the frequency of 640 MHz is about 23.9 cm, and ⅛ of the wavelength is about 3.0 cm. The inductance and the capacitance of the wiring pattern corresponding to 3.00 cm are 10.5 nH and 3.60 pF, respectively.

In the printed wiring board 401, the wiring pattern 420 has a microstrip-line structure, and has a width of 0.5 mm and a length of 9.00 cm. As in the third embodiment, the inductance value L=3.50 nH/cm, the capacitance value C=1.20 pF/cm. The propagation velocity is about $1.54 \times 10^5$ m/sec. Accordingly, transmission of a digital signal from the clock-signal generator IC 402 to the SDRAM IC 404 in the wiring pattern 420 having the length of 9.00 cm requires about 0.584 ns. The characteristic impedance at that time is about 54.0 Ω according to equation (4).

The wiring pattern 440 has a microstrip-line structure having a length of 7 cm, and is the same as the wiring pattern 420 up to a portion 4.00 cm from the clock-signal generator IC 402, with a width of 0.50 mm and an inductance value L=3.50 nH/cm, and a capacitance value C=1.20 pF/cm. At the succeeding portion having a length of 3.00 cm up to the memory controller IC 403, five pairs of a rectilinear narrow inductance pattern 441 having a width of 0.21 mm and a length of 0.60 cm, and a circular capacitive pattern 442 having a radius of 0.25 mm are provided with an equal interval. The inductance value L of the inductance pattern 441 and the capacitance value C of the capacitive pattern 442 are set to L=5.30 nH, and C=2.20 pF, as in the third embodiment.

The signal propagation time in the wiring pattern 440 is about $1.54 \times 10^5$ m/sec at a portion up to 4 cm from the clock-signal generator IC 402, and about $0.906 \times 10^5$ m/sec at the succeeding portion of 3 cm up to the memory controller IC 403. Accordingly, transmission of the clock signal from the clock-signal generator IC 402 to the memory controller IC 403 in the wiring pattern 440 having the length of 7 cm requires about 0.572 ns. This value is substantially the same as the propagation velocity of 0.584 from the clock-signal generator IC 402 to the SDRAM IC 404 via the wiring pattern 420, and the difference between the two values will cause no problem for a synchronizing signal.

The inductance value and the capacitance value of the wiring pattern 440 are 5.30 nH≦10.5 nH, and 2.20 pF≦3.60 pF, respectively, i.e., values much smaller than values corresponding to ⅛ of the wavelength for the frequency of 640 MHz. Accordingly, even if the respective pairs of the rectilinear narrow inductance pattern 441 and the capacitive pattern 442 are unmatched portions of the wiring pattern 440, large waveform distortion will not occur.

The characteristic impedance at that time is about 54.0 Ω at a portion up to 4.00 cm from the clock-signal generator IC 402, and about 49.1 Ω at a portion of 3.00 cm up to the memory controller IC 403, according to equation (4), and it can be considered that the difference is substantially constant in the wiring pattern 350. These values are substantially the same as the characteristic impedance of 54.0 Ω of the wiring pattern 360. The differences among these values will cause no problem for a synchronizing signal.

Next, an example is provided of a case in which, due to electric characteristics of the memory controller IC 403, and a delay time until the data signal I is transmitted from the memory controller IC 403 to the SDRAM IC 404 after the clock signal G has reached the memory controller IC 403 is 0.060 ns. In this case, by making the signal transmission time of the clock signal G to the memory controller IC 403 smaller than the signal transmission time of the clock signal H to the memory controller IC 403 by 0.060 ns, it is adjusted so that the clock signal H transmitted from the clock-signal generator IC 402 to the SDRAM IC 404, and the data signal I transmitted from the memory controller IC 303 reach the SDRAM IC 404 in a synchronized state.

In the wiring pattern 440, by increasing the width of the inductance pattern 441 from 0.21 mm to 0.25 mm, the inductance value is changed from 5.30 nH to 4.60 nH. By reducing the diameter of the circular capacitive pattern 442 from 0.25 mm to 0.15 mm, the capacitance value is changed from 2.20 pF to 1.80 pF. As a result, the signal propagation velocity in the wiring pattern 440 is about $1.54 \times 10^5$ m/sec at a portion up to 4.00 cm from the memory controller IC 303, and is about $1.098 \times 10^5$ m/sec at the succeeding portion up to 3 cm from the memory controller IC 403, where the pairs of the inductance pattern 441 and the capacitive pattern 442 are provided. Accordingly, propagation of the digital signal from the clock-signal generator IC 402 to the memory controller IC 403 by the wiring pattern 440 having the length of 7.00 cm requires about 0.533 ns.

This value is smaller than the time of propagation of the clock signal H from the clock-signal generator IC 402 to the SDRAM IC 404 by the wiring pattern 420 of 0.584 ns by 0.051 ns. Hence, the difference between times of arrival of the clock signal H and the data signal I to the SDRAM IC 404 is 0.009 ns. This value will cause no problem for a synchronizing signal.

The characteristic impedance of the wiring pattern 440 at that time is about 54.0 Ω at a portion up to 4 cm from the memory controller IC 303, and about 50.6 Ω at the succeeding portion up to 3 cm from the memory controller IC 403, according to equation (4). This value is substantially equal to the characteristic impedance of 54.0 Ω of the wiring pattern 360, and the difference between the two values will cause no problem for a synchronizing signal.

As described above, according to the fourth embodiment, by providing pairs of an inductance pattern and a capacitive pattern in the wiring pattern, when outputting the clock signals H and G from the clock-signal generator IC 402 to the memory controller IC 403 and the SDRAM IC 404 via the wiring pattern 440 and the wiring pattern 420, respectively, and outputting the bus signal I from the memory controller IC 403 to the SDRAM IC 404 and outputting the bus signal I' from the SDRAM IC 404 to the memory controller IC 403 via the wiring pattern 430, the clock signals G and H can substantially simultaneously reach in a state in which, for example, degradation in the waveform is hardly produced, even if the lengths of the wiring patterns 420 and 440 differ. It is thereby possible to propagate the clock signal H and the bus signal I to the SDRAM IC 404 in a synchronized state, and propagate the clock signal G and the bus signal I' to the memory controller IC 403 in a synchronized state. By adjusting the signal propagation velocity by changing the inductance value and the capacitance value, the signal transmission time can be adjusted. Even if a signal delays due to a difference in electric characteristics, such as AC characteristics, DC characteristics and the like, between the memory controller IC 403 and the SDRAM IC 404, it is possible to propagate the clock signal H and the bus signal I to the SDRAM IC 404 in a synchronized state, and propagate the clock signal G and the bus signal I' to the memory controller IC 403 in a synchronized state.

Since the characteristic impedance of the wiring pattern 440 is substantially constant, and the characteristic impedance values of the wiring pattern 420 and the wiring pattern 440 are very close, the characteristic impedance values of signal patterns are also matched, and distortions in the waveform, such as ringing, can be minimized.

Fifth Embodiment

Figure 10:
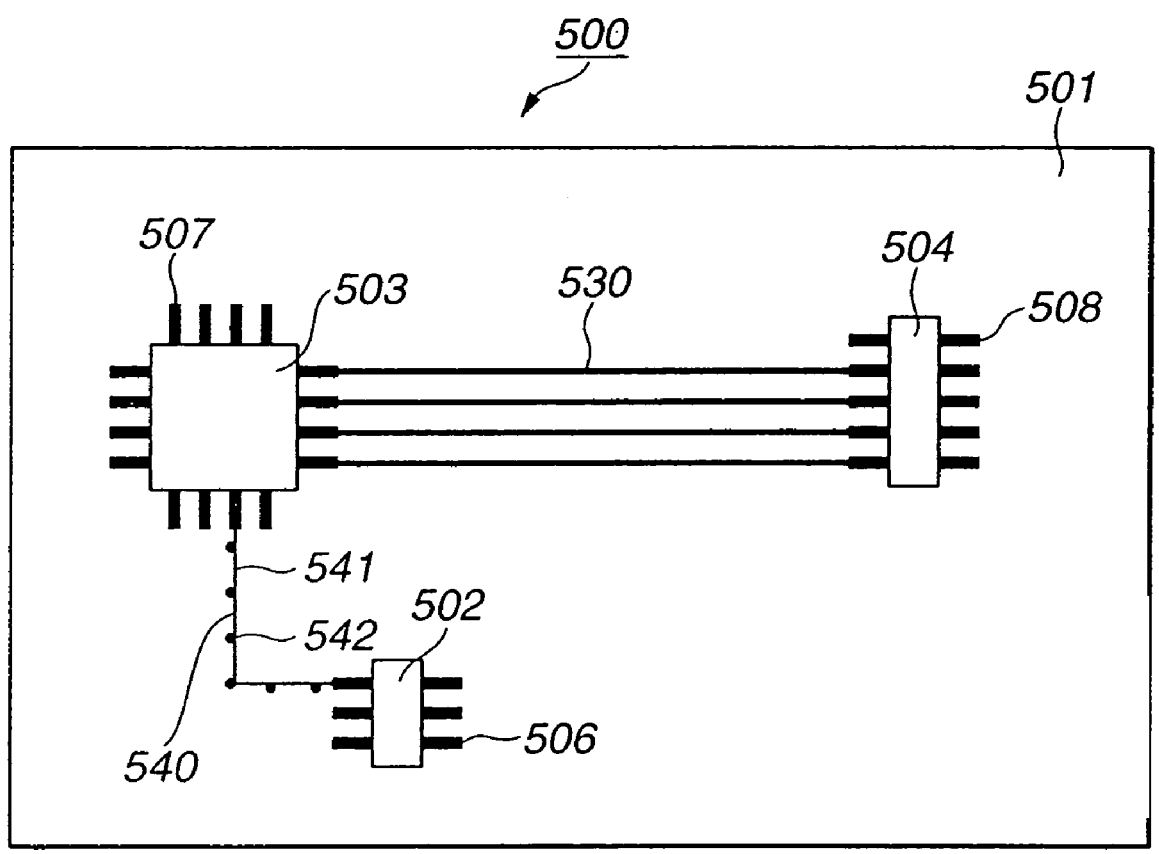
FIG. 10 is a schematic diagram illustrating a printed circuit board according to a fifth embodiment of the present invention.
Figure 11:
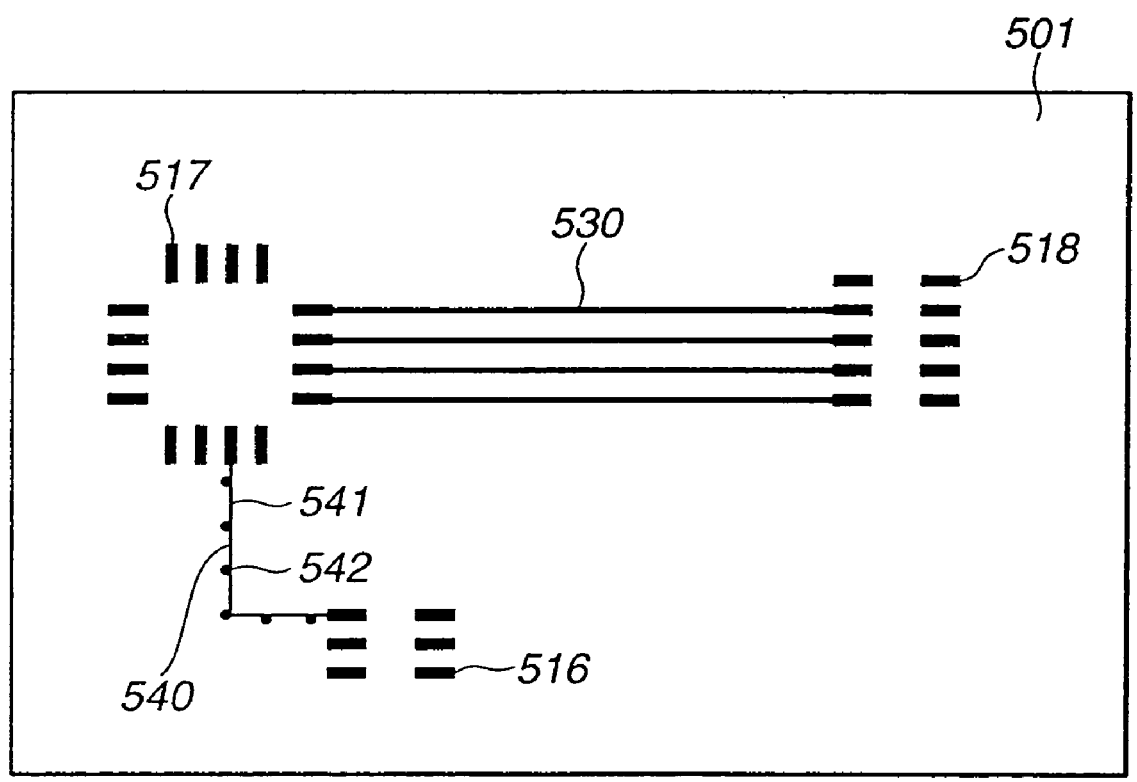
FIG. 11 is a schematic diagram illustrating a printed wiring board according to the fifth embodiment.

FIG. 10 illustrates a printed circuit board 500 according to a fifth embodiment of the present invention. FIG. 11 illustrates a printed wiring board in which IC's are not mounted on the printed circuit board shown in FIG. 10.

In FIG. 10, there is shown a printed circuit board 500. A clock-signal generator IC 502, a memory controller IC 503 and an SDRAM IC 504 are mounted on a printed wiring board 501. The clock-signal generator IC 502 and the SDRAM IC 504 are SOP-type ICs, and the memory controller IC 503 is a QFP-type IC. Lead portions 506, 507 and 508 of the respective ICs are bonded to lands 516, 517 and 518 (see FIG. 11), respectively, of the printed wiring board 501 by soldering.

In the fifth embodiment, the signal transmission time of a clock signal J propagated from the clock-signal generator IC 502 to the memory controller IC 503 is adjusted with the time of arrival of a bus signal K from the SDRAM IC 504 to the memory controller IC 503.

A wiring pattern 540 is the same as the wiring pattern 340 in the third embodiment. In the wiring pattern 540, six pairs of a rectilinear inductance pattern 541 and a circular capacitive pattern 542 are consecutively provided with an equal interval. By measuring the time of arrival of the bus signal K to the memory controller IC 503 in advance, and changing the inductance value of the inductance pattern 541 and the capacitance value of the capacitive pattern 542 so that the memory controller IC 503 normally operates, the time of arrival of the clock signal J to the memory controller IC 503 is adjusted. The inductance value can be adjusted by changing the length and the width of the inductance pattern 541. The capacitance value can be adjusted by changing the radius of the circular capacitive pattern 542. The times of arrival of the clock signal J and the bus signal K to the memory controller IC 503 are not necessarily the same. By slightly shifting the times, the memory controller IC 503 sometimes normally operates. Since the operation of the fifth embodiment is basically the same as the operation of the third embodiment, further description of the operation of the fifth embodiment will be omitted.

As described above, according to the fifth embodiment, by providing pairs of an inductance pattern and a capacitive pattern at part of the wiring pattern, when outputting the clock signal J from the clock-signal generator IC 502 to the memory controller IC 503 via the wiring pattern 540, and outputting the bus signal K from the SDRAM IC 504 to the memory controller IC 503 via the bus wiring pattern 530, the clock signal J synchronized with the bus signal K from the SDRAM IC 504 via the bus wiring pattern 530 can be propagated in a state in which, for example, degradation in the waveform is hardly produced. By changing the inductance value and the capacitance value, it is possible to adjust the signal propagation velocity, and the signal transmission time.

By making the characteristic impedance of the wiring pattern 540 substantially constant, and making the characteristic impedance values of the wiring pattern 520 and the wiring pattern 540 substantially the same, the characteristic impedance values of signal patterns are also matched, and distortion in the waveform, such as ringing or the like, can be minimized.

Sixth Embodiment

Figure 12:
FIG. 12 is a diagram illustrating the shapes of an inductance pattern and a capacitive pattern according to a sixth embodiment of the present invention.

FIG. 12 illustrates a wiring pattern having pairs of an inductance pattern and a capacitive pattern, according to a sixth embodiment of the present invention. In the sixth embodiment, a plurality of pairs of the inductance pattern and the capacitive pattern are consecutively formed. In FIG. 12, reference numeral 13 represents an inductance pattern, and reference numeral 14 represents a capacitive pattern. In the sixth embodiment, the capacitive pattern 14 has the shape of a triangle, and contacts one side of the rectilinear narrow inductance pattern 13. By using this wiring pattern as the wiring pattern of each of the first through fifth embodiments, the same effects as those described above can be obtained.

Seventh Embodiment

Figure 13:
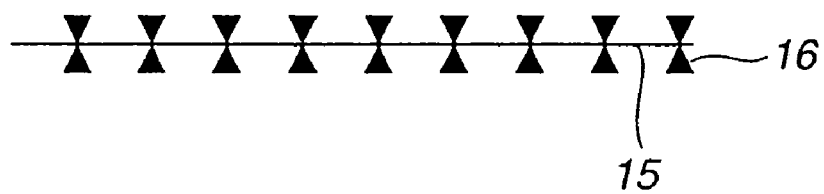
FIG. 13 is a diagram illustrating the shapes of an inductance pattern and a capacitive pattern according to a seventh embodiment of the present invention.

FIG. 13 illustrates a wiring pattern having pairs of an inductance pattern and a capacitive pattern, according to a seventh embodiment of the present invention. In the seventh embodiment, a plurality of pairs of the inductance pattern and the capacitive pattern are consecutively formed. In FIG. 13, reference numeral 15 represents an inductance pattern, and reference numeral 16 represents a triangular capacitive pattern. In the seventh embodiment, by causing two capacitive patterns 16 to contact both sides of the same portion of the rectilinear narrow inductance pattern 15, a large capacitance value can be obtained. By using this wiring pattern as the wiring pattern of each of the first through fifth embodiments, the same effects as those described above can be obtained.

Eighth Embodiment

Figure 14:
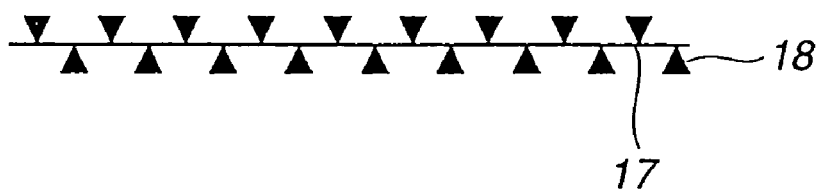
FIG. 14 is a diagram illustrating the shapes of an inductance pattern and a capacitive pattern according to an eighth embodiment of the present invention.

FIG. 14 illustrates a wiring pattern having pairs of an inductance pattern and a capacitive pattern, according to an eighth embodiment of the present invention. In the eighth embodiment, a plurality of pairs of the inductance pattern and the capacitive pattern are consecutively formed. In FIG. 14, reference numeral 17 represents a rectilinear narrow inductance pattern, and reference numeral 18 represents a triangular capacitive pattern. In the eighth embodiment, by causing capacitive patterns 18 to alternately contact both sides of the inductance pattern 17, the wiring pattern behaves as a distributed parameter pattern. By using this wiring pattern as the wiring pattern of each of the first through fifth embodiments, the same effects as those described above can be obtained.

Ninth Embodiment

Figure 15:
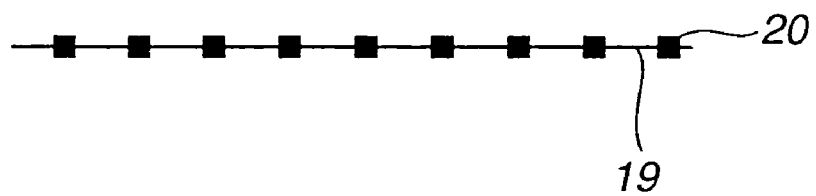
FIG. 15 is a diagram illustrating the shapes of an inductance pattern and a capacitive pattern according to a ninth embodiment of the present invention.

FIG. 15 illustrates a wiring pattern having pairs of an inductance pattern and a capacitive pattern, according to a ninth embodiment of the present invention. In the ninth embodiment, a plurality of pairs of the inductance pattern and the capacitive pattern are consecutively formed. In FIG. 15, reference numeral 19 represents a rectilinear narrow inductance pattern, and reference numeral 20 represents a thick rectilinear capacitive pattern. In the ninth embodiment, the capacitive patterns 20 and the inductance patterns 19 alternately contact. Since the inductance value can be reduced due to the thick rectilinear capacitive pattern 20, this shape is useful when increasing the capacitance value without greatly changing the inductance value. By using this wiring pattern as the wiring pattern of each of the first through fifth embodiments, the same effects as those described above can be obtained.

Tenth Embodiment

Figure 16:
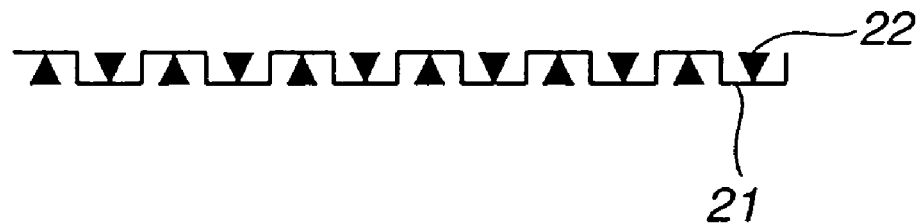
FIG. 16 is a diagram illustrating the shapes of an inductance pattern and a capacitive pattern according to a tenth embodiment of the present invention.

FIG. 16 illustrates a wiring pattern having pairs of an inductance pattern and a capacitive pattern, according to a tenth embodiment of the present invention. In the tenth embodiment, a plurality of pairs of the inductance pattern and the capacitive pattern are consecutively formed. In FIG. 16, reference numeral 21 represents a narrow inductance pattern, and reference numeral 22 represents a triangular capacitive pattern. This wiring pattern is useful when increasing the inductance value by folding the inductance pattern 21 between the adjacent capacitive patterns 22. By using this wiring pattern as the wiring pattern of each of the first through fifth embodiments, the same effects as those described above can be obtained.

Eleventh Embodiment

Figure 17:
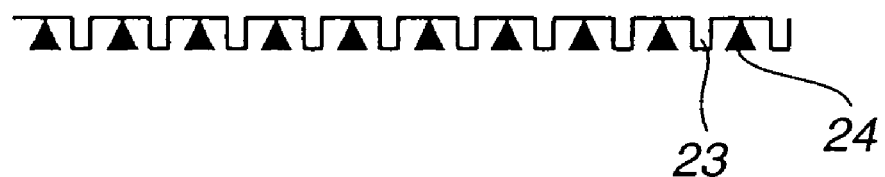
FIG. 17 is a diagram illustrating the shapes of an inductance pattern and a capacitive pattern according to an eleventh embodiment of the present invention.

FIG. 17 illustrates a wiring pattern having pairs of an inductance pattern and a capacitive pattern, according to an eleventh embodiment of the present invention. In the eleventh embodiment, a plurality of pairs of the inductance pattern and the capacitive pattern are consecutively formed. In FIG. 17, reference numeral 23 represents a narrow inductance pattern, and reference numeral 24 represents a triangular capacitive pattern. This wiring pattern is useful when further increasing the inductance value by folding the inductance pattern 21 twice between the adjacent capacitive patterns 22. By using this wiring pattern as the wiring pattern of each of the first through fifth embodiments, the same effects as those described above can be obtained.

Twelfth Embodiment

Figure 18:
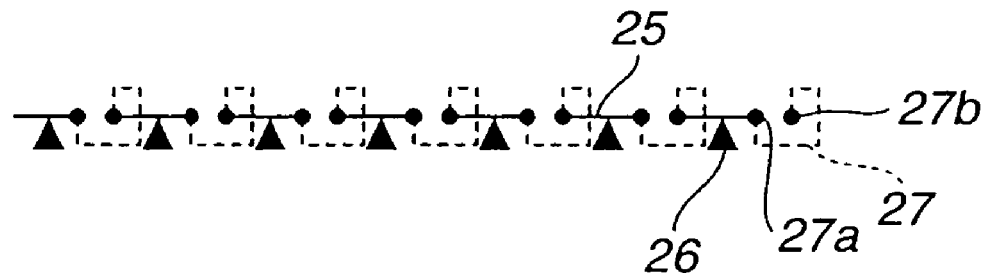
FIG. 18 is a diagram illustrating the shapes of an inductance pattern and a capacitive pattern according to a twelfth embodiment of the present invention.

FIG. 18 illustrates a wiring pattern having pairs of an inductance pattern and a capacitive pattern, according to a twelfth embodiment of the present invention. In the twelfth embodiment, a plurality of pairs of the inductance pattern and the capacitive pattern are consecutively formed. In FIG. 18, reference numeral 25 represents a narrow inductance pattern, and reference numeral 26 represents a triangular capacitive pattern. In the twelfth embodiment, the printed wiring board is a multilayer board, in which the inductance pattern 25 is connected to a spiral inductance pattern 27 formed on another layer of the printed wiring board through via holes 27a and 27b. Accordingly, this structure is useful when increasing the inductance value. By using this wiring pattern as the wiring pattern of each of the first through fifth embodiments, the same effects as those described above can be obtained.

The shapes of the wiring patterns shown in FIG. 3 and FIGS. 10–16 may be appropriately selected depending on the arrangement of respective ICs, such as a clock-signal generator IC, a memory controller IC, an SDRAM IC and the like, the wire length of wiring patterns interconnecting the ICs, the frequency, the rise time and the fall time of each clock signal, the dielectric constant of a printed wiring board, and the like.

According to the present invention, in a printed wiring board or a printed circuit board in which wiring patterns for interconnecting a plurality of ICs operating with synchronizing signals, by forming a plurality of consecutive pairs of an inductance pattern and a capacitive pattern at at least part of each wiring pattern, the propagation velocity of a signal propagating in a wiring pattern can be adjusted. As a result, utilizing a limited space of a printed wiring board, it is possible to make the signal transmission times of a bus signal in bus wiring between different ICs, clock signals between respective ICs, and synchronizing signals synchronized with the clock signals substantially the same. It is also possible to slightly shift signal transmission times in accordance with the electric characteristics of respective ICs easily.

By changing the shapes of the inductance pattern and the capacitive pattern formed in the wiring pattern, the signal propagation time can be easily adjusted.

Furthermore, since it is unnecessary to partially change a dielectric in a printed wiring board, an ordinary printed wiring board can be used without requiring a complicated manufacturing process. Accordingly, it is possible to provide an inexpensive printed wiring board or printed circuit board.

By arranging such that, when a smaller one of a rise time $t_r$ from 10% to 90% of a maximum amplitude and a fall time $t_f$ from 90% to 10% of the maximum amplitude of a synchronizing signal propagating through a pattern having a pair of inductance pattern and a capacitive pattern is represented by $t_s$, and a value of inductance and a value of capacitance corresponding to a length of ⅛ of a wavelength for a frequency f determined by $f=1/(\pi t_s)$ are represented by $L_s$ and $C_s$, respectively, a value of inductance $L_p$ and a value of capacitance $C_p$ by the pair of the inductance pattern and the capacitive pattern satisfy a relationship of $L_p \leq L_s$, and $C_p \leq C_s$, it is possible to suppress waveform distortion, such as degradation of a signal, when adjusting the signal propagation velocity to have a smaller value.

By making the characteristic impedance values of wiring patterns to be the same, the characteristic impedance values of signal patterns are matched, and waveform distortions, such as ringing, can be suppressed.

The individual components shown in outline in the drawings are all well known in the printed wiring board and printed circuit board arts and their specific construction and operation are not critical to the operation or the best mode for carrying out the invention.

While the present invention has been described with respect to what are presently considered to be the preferred embodiments, it is to be understood the invention is not limited to the disclosed embodiments. To the contrary, the present invention is intended to cover various modifications and equivalent arrangements included within the spirit and scope of the appended claims. The scope of the following claims is to be accorded the broadest interpretation so as to encompass all such modifications and equivalent structures and functions.

What is claimed is:

1. A printed wiring board comprising:
   plural lands for mounting a corresponding plurality of integrated circuits (ICs) operated with synchronizing signals; and
   a plurality of wiring patterns for interconnecting said lands,
   wherein plural pairs of an inductance pattern and a capacitive pattern are consecutively constructed along said wiring pattern to adjust a transmission time of the synchronizing signals.

2. A printed wiring board according to claim 1, wherein the inductance pattern has a meander shape.

3. A printed wiring board according to claim 1, wherein the inductance pattern has a spiral shape.

4. A printed wiring board according to claim 1, wherein the capacitive pattern is connected to the inductance pattern at a connection, and wherein the width of the connection is equal to or less than a width of the inductance pattern.

5. A printed wiring board comprising:
a first land for mounting a first IC;
a second land for mounting a second IC, said second land connected to said first land by a first wiring pattern, wherein the first wiring pattern propagates a first signal from the first IC to the second IC; and
a third land for mounting a third IC, wherein the third IC has the same function as the second IC, and said third land is connected to said first land by a second wiring pattern, wherein the second wiring pattern propagates a second signal synchronized with the first signal from the first IC to the third IC, and wherein the second wiring pattern is shorter than the first wiring pattern,
wherein plural pairs of an inductance pattern and a capacitive pattern are consecutively constructed along the second wiring pattern to adjust transmission times of the first signal and the second signal.

6. A printed wiring pattern according to claim 5, wherein the transmission times of the first and second signals are substantially the same.

7. A printed wiring board according to claim 5, wherein characteristic impedance of the first wiring pattern and characteristic impedance of the second wiring pattern are substantially the same.

8. A printed wiring board comprising:
a first land for mounting a first IC; and
a second land for mounting a second IC, said second land connected to said first land by a bus wiring pattern, said bus wiring pattern comprising a plurality of wiring patterns, and transmitting a bus signal from the first IC to the second IC;
wherein plural pairs of an inductance pattern and a capacitive pattern are consecutively constructed along the bus wiring pattern to adjust transmission times of the bus signal.

9. A printed wiring board according to claim 8, wherein transmission times of respective signals transmitted by the plurality of wiring patterns are substantially the same.

10. A printed wiring board according to claim 8, wherein each of the plurality of wiring patterns has a substantially same value of characteristic impedance.

11. A printed wiring board comprising:
a first land for mounting a first IC;
a second land for mounting a second IC, said second land connected to said first land by a first wiring pattern, wherein the first wiring pattern propagates a first signal from the first IC to the second IC; and
a third land for mounting a fourth IC, wherein the fourth IC has a function different from the second IC and is connected to said first land by a third wiring pattern, and wherein the third wiring pattern propagates a third signal synchronized with the first signal from the first IC to the fourth IC,
wherein plural pairs of an inductance pattern and a capacitive pattern are consecutively constructed along at least one of the first wiring pattern and the third wiring pattern to respectively adjust a transmission time of the first signal or the third signal.

12. A printed wiring board according to claim 11, wherein characteristic impedance of the first wiring pattern and characteristic impedance of the third wiring pattern are substantially the same.

13. A printed wiring board according to claim 11, wherein at least one of the first and third signals is a clock signal.

14. A printed wiring board comprising:
a first land for mounting a first IC;
a second land for mounting a second IC, said second land connected to said first land by a first wiring pattern, wherein the first wiring pattern propagates a first signal from the first IC to the second IC; and
a third land for mounting a fifth IC, said third land connected to said second land by a fourth wiring pattern, wherein the fourth wiring pattern propagates a fourth signal from the fifth IC to the second IC,
wherein plural pairs of an inductance pattern and a capacitive pattern are consecutively constructed along at least one of the first wiring pattern and fourth wiring pattern to respectively adjust a transmission time of the first signal or the fourth signal.

15. A printed wiring board according to claim 14, wherein characteristic impedance of the first wiring pattern and characteristic impedance of the fourth wiring pattern are substantially the same.

16. A printed wiring board according to claim 14, wherein at least one of the first and fourth signals is a clock signal.

17. A printed circuit board comprising:
a first IC;
a second IC connected to said first IC by a first wiring pattern, wherein the first wiring pattern propagates a first signal from said first IC to said second IC; and
a third IC having the same function as said second IC, said third IC connected to said first IC by a second wiring pattern, wherein the second wiring pattern propagates a second signal synchronized with the first signal from said first IC to said third IC, and wherein the second wiring pattern is shorter than the first wiring pattern,
wherein plural pairs of an inductance pattern and a capacitive pattern are consecutively constructed along the second wiring pattern to adjust transmission times of the first signal and the second signal.

18. A printed circuit board comprising:
a first IC; and
a second IC connected to said first IC by a bus wiring pattern, the bus wiring pattern including a plurality of wiring patterns and transmitting a bus signal from said first IC to said second IC,
wherein plural pairs of an inductance pattern and a capacitive pattern are consecutively constructed along the bus wiring pattern to adjust transmission times of the bus signal.

19. A printed circuit board comprising:
a first IC;
a second IC connected to said first IC by a first wiring pattern, wherein the first wiring pattern propagates a first signal from said first IC to said second IC; and
a fourth IC having a function different from said second IC, said fourth IC connected to said first IC by a third wiring pattern, wherein the third wiring pattern propagates a third signal synchronized with the first signal from said first IC to said fourth IC,
wherein plural pairs of an inductance pattern and a capacitive pattern are consecutively constructed along at least one of the first wiring pattern and the third wiring pattern to adjust transmission times of the first signal and the third signal.

20. A printed circuit board comprising:
a first IC;
a second IC connected to said first IC by a first wiring pattern, wherein the first wiring pattern propagates a first signal from said first IC to said second IC; and
a fifth IC connected to said second IC by a fourth wiring pattern, wherein the fourth wiring pattern propagates a fourth signal from said fifth IC to said second IC,
wherein plural pairs of an inductance pattern and a capacitive pattern are consecutively constructed along at least one of the first wiring pattern and fourth wiring pattern to respectively adjust a transmission times of the first signal or the fourth signal.

* * * * *